(12) United States Patent
Mattausch et al.

(10) Patent No.: US 8,587,980 B2
(45) Date of Patent: Nov. 19, 2013

(54) ASSOCIATIVE MEMORY

(75) Inventors: Hans Juergen Mattausch, Higashihiroshima (JP); Tetsushi Koide, Higashihiroshima (JP); Tania Ansari, Higashihiroshima (JP); Wataru Imafuku, Higashihiroshima (JP); Akihiro Kaya, Higashihiroshima (JP)

(73) Assignee: Hiroshima University, Hiroshima (JP)

( * ) Notice: Subject to any disclaimer, the term of this patent is extended or adjusted under 35 U.S.C. 154(b) by 50 days.

(21) Appl. No.: 13/499,112

(22) PCT Filed: Sep. 24, 2010

(86) PCT No.: PCT/JP2010/066563
§ 371 (c)(1),
(2), (4) Date: Mar. 29, 2012

(87) PCT Pub. No.: WO2011/040335
PCT Pub. Date: Apr. 7, 2011

(65) Prior Publication Data
US 2012/0188811 A1 Jul. 26, 2012

(30) Foreign Application Priority Data
Oct. 1, 2009 (JP) ................................ 2009-229601

(51) Int. Cl.
*G11C 15/00* (2006.01)
(52) U.S. Cl.
USPC .................. 365/49.17; 365/49.1; 365/189.07
(58) Field of Classification Search
USPC ......... 365/49.17, 49.1, 189.07, 189.09, 233.1
See application file for complete search history.

(56) References Cited

U.S. PATENT DOCUMENTS

| | | | |
|---|---|---|---|
| 7,852,652 B1 * | 12/2010 | Fabry | 365/49.17 |
| 2002/0125500 A1 | 9/2002 | Mattausch et al. | |
| 2005/0162878 A1 | 7/2005 | Koide et al. | |
| 2009/0141531 A1 | 6/2009 | Abedin et al. | |

FOREIGN PATENT DOCUMENTS

| | | | |
|---|---|---|---|
| JP | 2002288985 A | 10/2002 | |
| JP | 2005209317 A | 8/2005 | |
| JP | 2009134810 A | 6/2009 | |

OTHER PUBLICATIONS

English Translation of the International Preliminary Report on Patentability (Chapter II) of PCT/JP2010/066563, dated Apr. 12, 2012.
D. R. Tveter, "The Pattern Recognition Basis of Artificial Intelligence," Los Alamitos, CA: IEEE computer society, pp. 86-92, 1998.

(Continued)

*Primary Examiner* — David Lam
(74) *Attorney, Agent, or Firm* — Lowe, Hauptman & Ham

(57) ABSTRACT

An associative memory capable of reducing erroneous searches is provided. A storage memory in the associative memory stores reference data. A comparator circuit receives externally applied search data and obtains the distance (for example, the Hamming distance) between the reference data and the search data. An oscillating circuit outputs a pulse signal with an oscillating frequency corresponding to the distance obtained by the comparator circuit. Similarly, the oscillating circuits output pulse signals with oscillating frequencies according to the distance between the reference data in corresponding storage circuits and the search data. A WTA circuit receives the pulse signals. Reference data stored in a storage circuit corresponding to an oscillating circuit that outputs a pulse signal with the highest frequency is determined as the most similar reference data (Winner) to the search data.

12 Claims, 22 Drawing Sheets

(56) References Cited

OTHER PUBLICATIONS

H. J. Mattausch et al., "Compact Associative-Memory Architecture with Fully-Parallel Search Capability for the Minimum Hamming Distance," IEEE Journal of Solid-State Circuits, vol. 37, No. 2, pp. 218-227, Feb. 2002.

H. J. Mattausch et al., "Fully-Parallel Pattern-Matching Engine with Dynamic Adaptability to Hamming or Manhattan Distance," 2002 Symposium on VLSI Circuits Digest of Technical Papers, pp. 252-255, Jun. 2002.

M. Ikeda, et al., "Time-Domain Minimum-Distance Detector and Its Application to Low-Power Coding Schema on Chip-Interface," Proc. of ESSCIRC '98, pp. 464-467, Sep. 1998.

H. J. Mattausch et al., "Low Power Word-Parallel Nearest-Hamming-Distance Search Circuit based on Frequency Mapping", Proceedings of the 36th European Solid-State Circuits Conference (ESSCIRC 2010), IEEE, pp. 538-541, Sep. 2010.

T. T. Bui et al., "A Low-Power Associative Processor with the R-th Nearest-Match Hamming-Distance Search Engine Employing Time-Domain Techniques", 2010 fifth IEEE International Symposium on Electronic Design, Test and Applications, IEEE, pp. 54-57, Jan. 2010.

* cited by examiner

ASSOCIATIVE MEMORY

RELATED APPLICATIONS

The present application is a National Phase of International Application Number PCT/JP2010/066563, filed Sep. 24, 2010, and claims priority from Japanese Application Number 2009-229601, filed Oct. 1, 2009.

TECHNICAL FIELD

The present invention relates to an associative memory having a minimum distance search function.

BACKGROUND ART

In the field of image compression and image recognition, associative memories with a minimum distance search function have attracted attention. The associative memory stores R pieces of reference data each having a bit width W (W and R are natural numbers). When a data string (search data) is input, the associative memory searches the plurality of reference data pieces for the most similar data piece (having the shortest distance).

It is basic processing in pattern matching to find the most similar reference data to the input data string (see Non-Patent Document 1). Therefore, the minimum distance search associative memory is useful in information processing such as image compression and image recognition. The minimum distance search associative memory is for example disclosed in Patent Document 1. Furthermore, fully parallel associative memories having search capability for Hamming distance, Manhattan distance and Euclidian distance are disclosed by Patent Document 2 and Non-patent Documents 2 and 3.

PRIOR ART DOCUMENT

Patent Document

Patent Document 1: JP 2002-288985 A
Patent Document 2: JP 2005-209317 A

Non-Patent Documents

Non-Patent Document 1: D. R. Tveter, "The Pattern Recognition Basis of Artificial Intelligence," Los Alamitos, Calif.: IEEE computer society, 1998.
Non-Patent Document 2: H. J. Mattausch, T. Gyohten, Y. Soda, and T. Koide, "Compact Associative-Memory Architecture with Fully-Parallel Search Capability for the Minimum Hamming Distance," IEEE Journal of Solid-State Circuits, Vol. 37, pp. 218-227, 2002.
Non-Patent Document 3: H. J. Mattausch, N. Omori, S. Fukae, T. Koide and T. Gyohten, "Fully-Parallel Pattern-Matching Engine with Dynamic Adaptability to Hamming or Manhattan Distance," 2002 Symposium on VLSI Circuits Digest of Technical Papers, pp. 252-255, 2002.
Non-Patent Document 4: M. Ikeda, et al., "Time-domain minimum-distance detector and its application to low-power coding schema on chip-interface," Proc. of ESS-CIRC '97, pp. 464-467, 1998.

SUMMARY OF THE INVENTION

Problems to be Solved by the Invention

A conventional associative memory includes a memory array portion, a Winner Line-up amplifier (hereinafter referred to as "WLA") circuit and a Winner Take All (hereinafter referred to as "WTA") circuit. The memory array portion includes memory cells arranged in a matrix of rows and columns. A plurality of memory cells arranged in the same row of the memory array portion store W-bit width reference data. The memory array portion further includes a plurality of comparator circuits each corresponding to a row. The comparator circuit generates a comparison current signal depending on the distance between reference data stored in memory cells in a corresponding row and externally input search data.

The WLA circuit includes a plurality of current-voltage converter circuits each corresponding to a comparator circuit. The current-voltage converter circuits each convert a comparison current signal output from a corresponding comparator circuit into a voltage. The WLA circuit amplifies a voltage with the lowest voltage level among the plurality of converted voltages into a prescribed voltage $V_W$ as Winner and amplifies the other voltages into a prescribed voltage $V_L$ as Loser. Here, the Winner corresponds to reference data that is the most similar to the search data and the Loser corresponds to reference data other than the most similar reference data to the search data. The WTA circuit further amplifies the voltage received from the WLA circuit for output. In the associative memory, the reference data stored in a memory cell in a row amplified into the voltage $V_W$ is determined as the most similar reference data to the search data.

In order to amplify the plurality of converted voltages into the voltages $V_W$ and $V_L$, the WLA circuit determines whether each voltage is greater than a prescribed threshold voltage $V_{ref}$ using a transistor element provided corresponding to each row. Voltages smaller than the threshold voltage $V_{ref}$ are amplified into voltage $V_W$ and voltages greater than the threshold voltage $V_{ref}$ are amplified into voltage $V_L$.

The transistor elements used for the above-described voltage determination must have matched characteristics for each row. However, the transistors inevitably have varied characteristics. If transistors with different characteristics are used for voltage determination, a voltage in a row that should not be amplified into a voltage $V_W$ may inadvertently be amplified into a voltage $V_W$. In short, the conventional associative memory that searches for reference data by converting a comparison current signal in each row into a voltage is prone to erroneous searches.

DISCLOSURE OF THE INVENTION

An object of the present invention is to provide an associative memory capable of reducing erroneous searches.

According to the present invention, an associative memory includes storing means, comparing means, pulse generating means, and determining means. The storing means stores a plurality of reference data pieces. The comparing means compares input search data and each of the plurality of reference data pieces in parallel and obtains the distance between the search data and the reference data pieces for each of the reference data pieces. The pulse generating means generates a pulse signal having a frequency corresponding to the obtained distance for each of the reference data pieces. The determining means that determines a most similar reference data piece to the search data among the plurality of reference data pieces based on the frequencies of the plurality of generated pulse signals.

The associative memory according to the present invention does not convert the distance between the reference data and the search data into a current value or a voltage value and generates a pulse signal having an oscillating frequency corresponding to the distance. Analog processing such as conversion of the distance into a current value or a voltage value is not included, so that erroneous searches attributable to characteristic variations of transistor devices are less likely to take place.

The pulse generating means preferably includes a plurality of oscillating means corresponding to the plurality of reference data pieces. Each of the oscillating means outputs a pulse signal with a higher frequency as the distance between the search data and the corresponding reference data piece is reduced. The determining means determines a reference data piece corresponding to oscillating means that has output a pulse signal with a highest oscillating frequency as the most similar reference data piece to the search data.

The determining means more preferably further includes a plurality of determining means corresponding to the plurality of oscillating means. The determining means determines the most similar reference data to the search data based on the determining means that receives a pulse signal earliest from oscillating means among the plurality of determining means.

In this case, the most similar reference data to the search data is determined based on the difference in timing to receive a pulse signal instead of the current/voltage difference. Therefore, the result is less affected by characteristic variations of the transistor devices.

The associative memory preferably further includes a plurality of frequency-dividing means corresponding to the oscillating means. Each of the frequency-dividing means frequency-divides a pulse signal output from corresponding oscillating means with a prescribed frequency-dividing ratio and outputting a result to corresponding determining means.

In this case, the determining means can specify an earliest received pulse signal with higher precision.

The determining means preferably further includes a latch instruction node connected to the plurality of determining means and charging means for charging the latch instruction node. Each of the determining means includes discharging means and latch means. The discharging means receives an output signal from corresponding oscillating means and discharges the latch instruction node when the output signal is a pulse signal. The latch means latches the output signal received by the discharging means when the latch instruction node is discharged.

In this case, the determining means that receives the pulse signal earliest can make the level of an output signal to be output by the determining means different from the level of an output signal to be output from the other determining means.

The determining means preferably includes a plurality of judgment means connected in a tournament manner. Each of the plurality of judgment means provided in a first stage includes a plurality of first pulse judgment means, a pulse reception judgment node, and charging means. The first pulse judgment means receives an output signal from corresponding oscillating means. The first pulse judgment means receives an output signal from corresponding oscillating means. The pulse reception judgment node is connected to the plurality of first pulse judgment means. The charging means charges the pulse reception judgment node. The first pulse judgment means includes first discharging means and latch means. The first discharging means discharges the pulse reception node upon receiving a pulse signal as an output signal from the corresponding oscillating means. The latch means latches the output signal received by the first discharging means upon receiving a clock signal. The tournament judgment means arranged in a second stage and thereafter include a plurality of second pulse judgment means, the pulse reception judgment means, and charging means. The second pulse judgment means is connected to a pulse reception determining node in corresponding tournament judgment means in the preceding stage. The pulse reception judgment node is connected with the plurality of second pulse judgment means. The second pulse judgment means includes second charging means. The second charging means charges the pulse reception node when a pulse reception judgment node in corresponding judgment means in the preceding stage is discharged. The judgment means in the uppermost stage further includes clock signal generating means. The clock generating means outputs a clock signal when the pulse reception judgment node is discharged.

In this case, the load capacity at each of the pulse reception judgment node can be reduced. Therefore, the time required for a clock signal to be output after receiving a pulse clock can be reduced.

The oscillating means preferably includes a plurality of inverters connected in series and stage number selecting means. The stage number selecting means selects the number of stages of inverters according to the distance between search data and corresponding reference data piece.

In this case, an oscillating frequency can be adjusted according to the number of stages of inverters.

The determining means preferably includes a plurality of counter means corresponding to the plurality of oscillating means. The counter means receives a pulse signal from corresponding oscillating means and generates an activated output signal upon receiving a prescribed number of pulses.

In this case, reference data similar to search data can be determined sequentially based on the order of degrees of similarity to the search data.

The associative memory preferably further includes pulse invalidating means. The pulse invalidating mean invalidates a pulse signal output from oscillating means corresponding to reference data determined by the determining means until (j−1)-th search in the j-th search where j is an integer satisfying 1<j≤k and k is an integer equal to or more than 2.

In this case, reference data similar to search data can be determined sequentially based on the order of degrees of similarity to the search data.

BRIEF DESCRIPTION OF THE DRAWINGS

FIG. 8 is a chart for illustrating change in the waveform of a pulse signal when the frequency divider circuit in FIG. 7 is used.

BEST MODE FOR CARRYING OUT THE INVENTION

Figure 1:
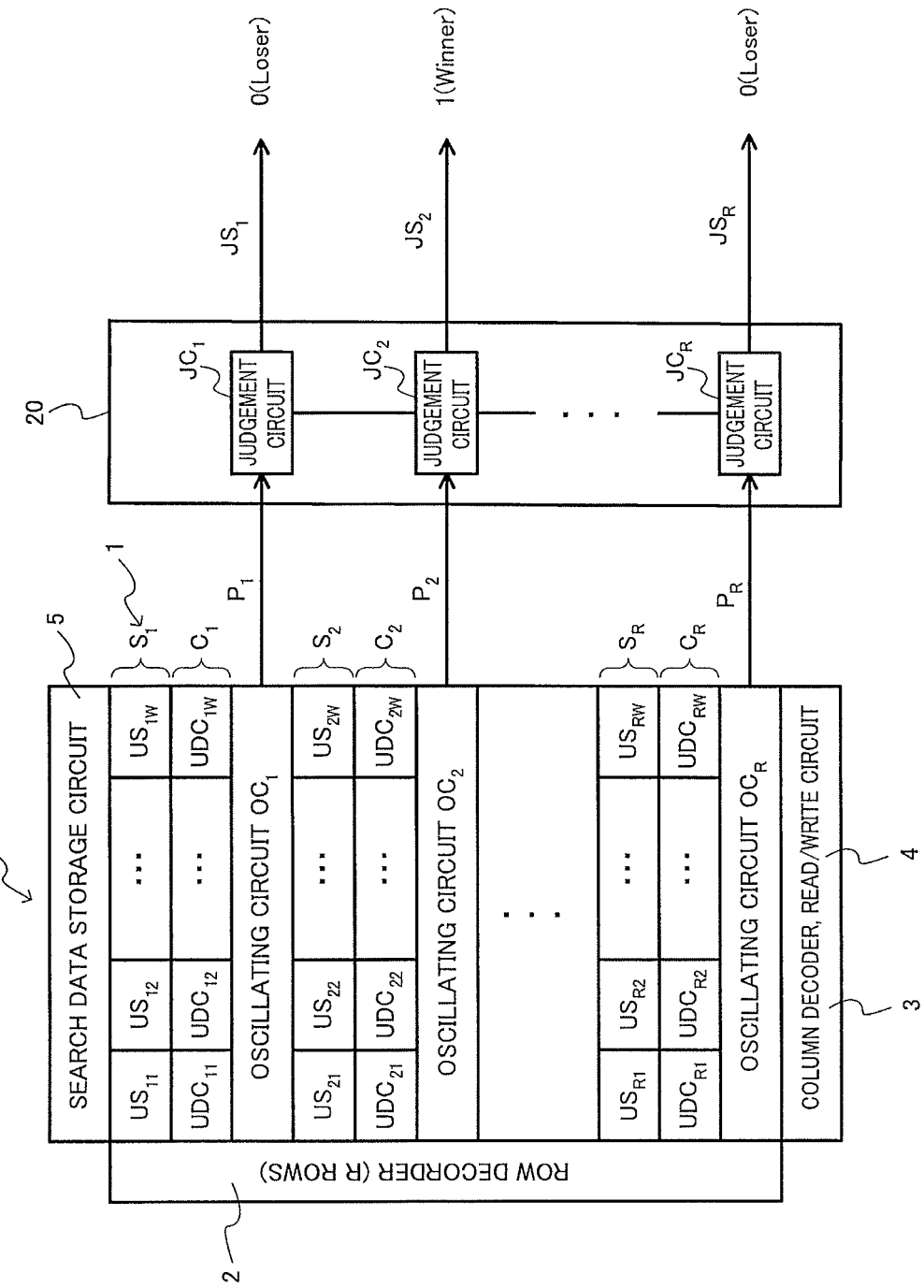
FIG. 1 is a functional diagram of an overall structure of an associative memory according to an embodiment of the present invention.

Hereinafter, embodiments of the present invention will be described in detail in conjunction with the accompanying drawing in which the same or corresponding portions are designated by the same reference characters, and their description will not be repeated.

First Embodiment

Overall Structure

Referring to FIG. 1, an associative memory 100 according to an embodiment of the present invention includes a memory array portion 10 and a WTA (Winner Take All) circuit 20.

The memory array portion 10 includes a memory portion 1, a row decoder 2, a column decoder 3, a Read/Write circuit 4, and a search data storage circuit 5.

The memory portion 1 includes unit data storage (Unit Storage: US) circuits $US_{11}$ to $US_{1W}$, $US_{21}$ to $US_{2W}$, ..., and $US_{R1}$ to $US_{RW}$. Here, W and R are both natural numbers equal to or greater than 2. In the following description, an arbitrary unit data storage circuit will be designated with $US_{ij}$ ($1 \leq i \leq W$, $1 \leq j \leq R$).

The unit data storage (Unit Storage: US) circuits $US_{11}$ to $US_{1W}$, $US_{21}$ to $US_{2W}$, ..., and $US_{R1}$ to $US_{RW}$ are arranged in a matrix of rows and columns. A plurality of unit data storage circuits $US_{ij}$ arranged in the same row form a storage circuit $S_i$. For example, the unit data storage circuit $US_{11}$ to $US_{1W}$ arranged in a first row form a storage circuit $S_1$. Similarly, the unit data storage circuits $US_{21}$ to $US_{2W}$ arranged in a second row form a storage circuit $S_2$ and the unit data storage circuits $US_{R1}$ to $US_{RW}$ arranged in the R-th row form a storage circuit $S_R$.

A storage circuit $S_i$ in each row stores W bit width reference data. More specifically, the storage circuit $S_1$ corresponding to the first row stores W bit width reference data. The storage circuit $S_2$ corresponding to the second row stores other reference data different from the reference data stored by the storage circuit $S_1$. A plurality of unit data storage circuit $US_{ij}$ in the storage circuit $S_i$ each store a corresponding one-bit data piece of the reference data.

The memory portion 1 further includes a plurality of comparator circuits $C_1$ to $C_R$ corresponding to the storage circuits $S_1$ to $S_R$. The comparator circuit $C_1$ corresponds to the storage circuit $S_1$ arranged in the first row. The comparator circuit $C_2$ corresponds to the storage circuit $S_2$ arranged in the second row. Similarly, the comparator circuit $C_R$ corresponds to the storage circuit $S_R$ arranged in the R-th row.

The comparator circuit $C_1$ includes a plurality of unit data comparator (Unit Comparator: UC) circuits $UC_{11}$ to $UC_{1W}$. Similarly, the comparator circuit $C_2$ corresponding to the second row includes a plurality of unit data comparator circuits $UC_{21}$ to $UC_{2W}$. Similarly, the comparator circuits $C_3$ to $C_R$ corresponding to the third row to the R-th row include a plurality of unit data comparator circuits $UC_{31}$ to $UC_{3W}$, ..., and $UC_{R1}$ to $UC_{RW}$.

The unit data comparator circuits $UC_{11}$ to $UC_{1W}$ are arranged corresponding to the unit data storage circuits $US_{11}$ to $US_{1W}$. The unit data comparator circuits $UC_{21}$ to $UC_{2W}$ are arranged corresponding to the unit data storage circuits $US_{21}$ to $US_{2W}$, respectively. Hereinafter, in the same manner, unit data comparator circuits $UC_{31}$ to $UC_{3W}$, ..., and $UC_{R1}$ to $UC_{RW}$ are arranged corresponding to the unit data storage circuits $US_{31}$ to $US_{3W}$, ..., and $US_{R1}$ to $US_{RW}$, respectively.

In the following description, an arbitrary comparator circuit will be designated with $C_i$ and an arbitrary unit data comparator circuit with $UC_{ij}$.

A comparator circuit $C_i$ in each row receives externally applied search data with a W bit width. The search data and W bit width reference data stored in a corresponding storage circuit $S_i$ are compared. More specifically, the comparator circuit $C_i$ obtains the distance between the search data and the reference data (the Hamming distance in this example). The comparison between the reference data in each row and the search data is executed in parallel. More specifically, each comparator circuit $C_i$ executes comparison between a reference data in a corresponding i-th row and the search data in parallel (simultaneously).

The memory portion 1 further includes a pulse generator circuit. The pulse generator circuit includes a plurality of oscillating (OC) circuits $OC_1$ to $OC_R$. Hereinafter, an arbitrary oscillating circuit will be referred to as $OC_i$.

Each oscillating circuit $OC_i$ is arranged in a row. More specifically, the oscillating circuit $OC_1$ corresponds to the storage circuit $S_1$ and the comparator circuit $C_1$. The oscillating circuit $OC_2$ corresponds to the storage circuit $S_2$ and the comparator circuit $C_2$. Similarly, the oscillating circuit $OC_R$ corresponds to the storage circuit $S_R$ and the comparator circuit $C_R$.

The oscillating circuit $OC_i$ outputs a pulse signal $P_i$ having an oscillating frequency based on the Hamming distance obtained by the comparator circuit $C_i$. More specifically, the oscillating circuit $OC_1$, outputs a pulse signal $P_1$ having an oscillating frequency based on the Hamming distance between reference data stored in the first row (storage circuit $S_1$) and the search data. The oscillating circuit $OC_2$ outputs a pulse signal $P_2$ having an oscillating frequency based on the Hamming distance between reference data in the second row and the search data. Similarly, the oscillating circuit $OC_R$ outputs a pulse signal $P_R$ having an oscillating frequency based on the Hamming distance between the reference data in the R-th row and the search data.

In short, the plurality of oscillating circuits $OC_1$ to $OC_R$ generate pulse signals $P_1$ to $P_R$ each corresponding to reference data in a corresponding row. The oscillating frequency of a pulse signal Pi corresponds to the Hamming distance between reference data in a corresponding row (i-th row) and search data. More specifically, as the Hamming distance decreases, the oscillating frequency increases whereas as the Hamming distance increases, the oscillating frequency decreases.

The row decoder 2 specifies a row-wise address in the memory portion 1. The column decoder 3 specifies a column-wise address in the memory portion 1. The Read/Write circuit 4 writes reference data in unit data storage circuits $US_{11}$ to $US_{1W}$, $US_{21}$ to $US_{2W}$, ..., and $US_{R1}$ to $US_{RW}$ specified by the row decoder 2 and the column decoder 3. The Read/Write circuit 4 further writes search data in the search data storage circuit 5.

The search data storage circuit 5 stores the search data written by the Read/Write circuit 4.

The WTA circuit 20 receives a plurality of pulse signals $P_1$ to $P_R$ generated by the pulse generator circuits (oscillating circuits $OC_1$ to $OC_R$). The WTA circuit 20 determines reference data that is the most similar to the search data based on the oscillating frequencies of the pulse signals $P_1$ to $P_R$. The WTA circuit 20 specifies a pulse signal $P_i$ having the largest oscillating frequency among the pulse signals $P_1$ to $P_R$. Then, reference data stored in a row corresponding to the specified pulse signal $P_i$ (the i-th row) is determined as the most similar reference data to the search data.

The WTA circuit 20 includes a plurality of judgment circuits $JC_1$ to $JC_R$ corresponding to the plurality of oscillating circuits $OC_1$ to $OC_R$. Hereinafter, an arbitrary judgment circuit will be designated with $JC_i$. The plurality of judgment circuits $JC_1$ to $JC_R$ receive corresponding pulse signals $P_1$ to $P_R$. Among the pulse signals $P_1$ to $P_R$, the voltage level of the pulse signal $P_i$ having the greatest oscillating frequency changes earliest. Among the judgment circuits $JC_1$ to $JC_R$, the judgment circuit $JC_i$ that receives the pulse signal $P_i$ that has changed in level earliest outputs an activated judgment signal $JS_i$. The other judgment circuits $JC_i$ that receive level-changed signals $P_i$ second earliest and afterwards output an inactivated judgment signal $JS_i$. The activated judgment signal JS indicates "1" and is made of voltage VDD. The inactivated judgment signal $JS_i$ indicates "0" and is made of voltage Vref (Vref<VDD). The activated judgment signal $JS_i$ indicates that reference data in a corresponding row (the i-th row) is the most similar reference data to the search data (hereinafter this reference data will be referred to as Winner). The inactivated judgment signal $JS_i$ indicates that the reference data in the corresponding row is not the most similar reference data to the search data (hereinafter this reference data will be referred to as Loser).

Assume that reference data stored in the storage circuit $S_2$ is for example the most similar data to the search data among a plurality of reference data pieces stored in the memory portion 1. In this case, the pulse signal $P_2$ has the highest oscillating frequency among the pulse signals $P_1$ to $P_R$. Therefore, the WTA circuit 20 activates only the judgment signal $JS_2$ among the judgment signals $JS_1$ to $JS_R$, and inactivates the other judgment signals $JS_i$.

As described above, the associative memory 100 does not convert the difference in distance between reference data and search data into current and voltage difference unlike the conventional associative memory. Instead, the differential distance is replaced by the difference between the oscillating frequencies of the pulses. If the distances are different, the oscillating frequencies are different. If the oscillating frequencies are different, the pulses rise (or fall) initially in different timings, so that the distance difference is replaced by time difference. The associative memory 100 determines the most similar reference data to search data based on the time difference. When the distance difference is converted into current and voltage differences, analog processing is carried out. In this case, transistor devices used to determine Winner and Loser may have varied characteristics, which may result in erroneous searches. In contrast, the associative memory 100 determines Winner by replacing the distance difference by the oscillating frequency difference (time difference). More specifically, Winner is determined by digital processing. In this way, the processing is less likely to be affected by varied characteristics of the transistor devices and therefore erroneous searches can be reduced.

Now, a unit data storage circuit $US_{ij}$ in a storage circuit $S_i$, a unit data comparator circuit $UC_{ij}$ in a comparator circuit $C_i$, the oscillating circuit $OC_i$ in the pulse generator circuit, and the WTA circuit 20 will be described in detail. In the following description, each of the bit data pieces that form reference data with a W bit width will be referred to as reference bit data. Each of the bit data pieces that form search data with a W bit width will be referred to as search bit data. More specifically, the reference data has W reference bit data pieces and the search data has W search bit data pieces corresponding to the reference bit data pieces.

Unit Data Storage Circuit and Unit Data Comparator Circuit

Figure 2:
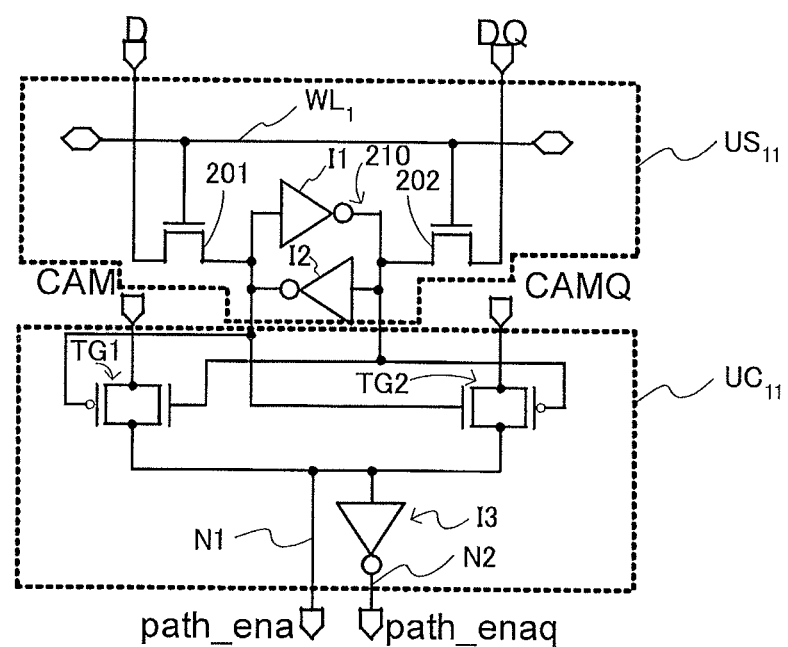
FIG. 2 is a circuit diagram of a unit data storage circuit and a unit data comparator circuit in FIG. 1.

Referring to FIG. 2, the unit data storage circuit $US_{11}$ forms an SRAM device. The unit data storage circuit $US_{11}$ includes a latch circuit 210 that latches data and n-type MOS transistors 201 and 202. The n-type MOS transistors 201 and 202 are connected in series. The latch circuit 210 is connected between the n-type MOS transistors 201 and 202. The n-type MOS transistors 201 and 202 have their gates connected to a word line $WL_1$.

The word line $WL_1$ is connected to the row decoder 2. When the row decoder 2 selects the word line $WL_1$, the n-type MOS transistors 201 and 202 turn on. At the time, the n-type MOS transistor 201 supplies the latch circuit 210 with externally input 1-bit reference bit data D that forms reference data. The n-type MOS transistor 202 receives reference bit data DQ as an inverted signal of the reference bit data D and supplies the received data to the latch circuit 210.

The latch circuit 210 includes two inverters I1 and I2. The inverter I1 has its input terminal connected to the output terminal of the inverter I2. The inverter I1 has its output terminal connected to the input terminal of the inverter I2. The inverter I1 receives the reference bit data D from the n-type MOS transistor 201. The inverter I2 receives the reference bit data DQ from the n-type MOS transistor 202. Therefore, the latch circuit 210 latches the 1-bit reference bit data D. The reference bit data D is either "1" or "0". When the reference bit data D is "1", a signal supplied from the n-type MOS transistor 201 to the latch circuit 210 is in an H level, and when the reference bit data D is "0", the signal is in an L level.

External search bit data CAM is input to the unit data comparator circuit $UC_{11}$. The search bit data CAM is 1-bit data that forms search data and corresponds to the unit data storage circuit $US_{11}$. The unit data comparator circuit $UC_{11}$ compares the reference bit data D stored in the unit data storage circuit $US_{11}$ and the search bit data CAM to obtain a distance (Hamming distance). The obtained distance is output to the corresponding oscillating circuit $OC_1$.

The unit data comparator circuit $UC_{11}$ includes two transfer gates TG1 and TG2 and an inverter I3.

The transfer gates TG1 and TG2 are each made of an n-type MOS transistor and a p-type MOS transistor. The gate of the p-type MOS transistor in the transfer gate TG1 receives the reference bit data D from the latch circuit 210 and the gate of the n-type MOS transistor receives the reference bit data DQ from the latch circuit 210. The gate of the p-type MOS transistor in the transfer gate TG2 receives the reference bit data DQ from the latch circuit 210 and the gate of the n-type MOS transistor receives the reference bit data D from the latch circuit 210.

In response to the level ("1" or "0") of the reference bit data D, one of the transfer gates TG1 and TG2 turns on and the other turns off. The transfer gate TG1 receives externally applied search bit data CAM. The transfer gate TG2 receives externally applied search bit data CAMQ that is an inverted signal of the search bit data CAM.

A node N1 outputs a signal output from the transfer gate TG1 or TG2 that has been turned on as a path enable signal path_ena. The inverter I3 outputs the inverse of the path enable signal path_ena as a path enable signal path_enaq. More specifically, the unit data comparator circuit $UC_{11}$ outputs these two signals path_ena and path_enaq. The two signals path_ena and path_enaq are a result of comparison between the reference bit data D and the search bit data CAM and corresponds to the Hamming distance.

When the reference bit data D and the search bit data CAM match, the signal path_ena attains an L level, and the signal path_enaq attains an H level. For example, when the reference bit data D and the search bit data CAM are both "1", the transfer gate TG1 is turned off and the TG2 is turned on. When the reference bit data D and the search bit data CAM are both "0", the transfer gate TG1 turns on and the transfer gate TG2 turns off. As a result, the signal path_ena attains an L level and the signal path_enaq attains an H level.

On the other hand, when the reference search bit data D and the search bit data CAM do not match, the signal path_ena attains an H level and the signal path_enaq attains an L level. For example, when the reference bit data D is "1" and the search bit data CAM is "0", the transfer gate TG1 turns off and the transfer gate TG2 turns on. When the reference bit data D is "0" and the search bit data CAM is "1", the transfer gate TG1 turns on and the transfer gate TG2 turns off. As a result, the signal path_ena attains an H level and the signal path_enaq attains an L level.

The signals path_ena and path_enaq determine the oscillating frequency of the pulse signal $P_1$ generated by the oscillating circuit $OC_1$.

Unit data storage circuits $US_{12}$ to $US_{1W}$, $US_{21}$ to $US_{2W}$, ... and $US_{R1}$ to $US_{RW}$ have the same configuration as that of the unit data storage circuit $US_{11}$. Unit data comparator circuits $UC_{12}$ to $UC_{1W}$, $UC_{21}$ to $UC_{2W}$, ... and $UC_{R1}$ to $UC_{RW}$ have the same configuration as that of the unit data comparator circuit $UC_{11}$.

Oscillating Circuit

The oscillating circuit $OC_1$ outputs a pulse signal $P_1$ with an oscillating frequency in response to the distance (Hamming distance) between W-bit width reference data and W-bit width search data stored in the storage circuit $S_1$. More specifically, as the distance between the reference data and the search data is reduced, in other words, as the reference data is more similar to the search data, the oscillating circuit $OC_1$ outputs the pulse signal $P_1$ with a higher frequency.

Figure 3:
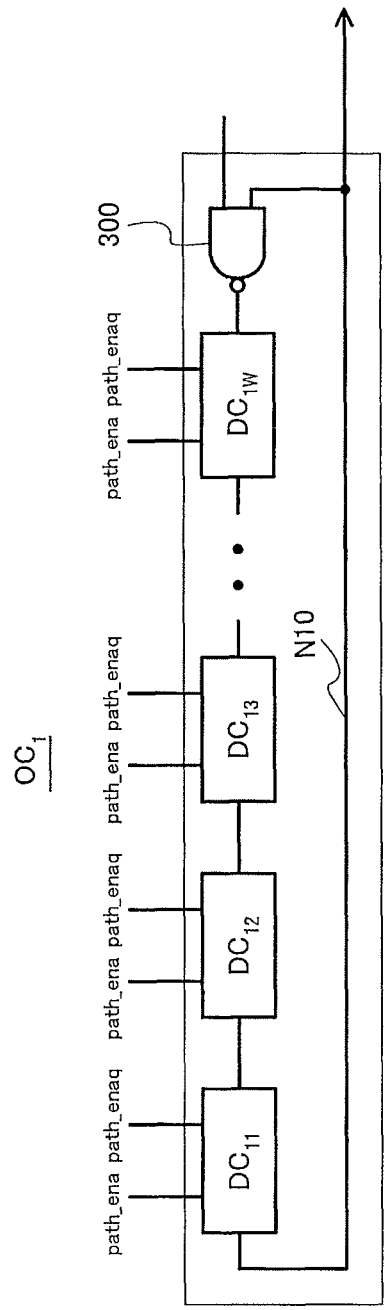
FIG. 3 is a functional block diagram of a structure of an oscillating circuit in FIG. 1.

FIG. 3 is a functional block diagram of the oscillating circuit $OC_1$. Referring to FIG. 3, the oscillating circuit $OC_1$ includes a plurality of delay circuits $DC_{11}$ to $DC_{1W}$. The delay circuits $DC_{11}$ to $DC_{1W}$ correspond to the unit data comparator circuits $UC_{11}$ to $UC_{1W}$.

The delay circuits $DC_{11}$ to $DC_{1W}$ are connected in series. In the series connection of the plurality of delay circuits $DC_{11}$ to $DC_{1W}$, the delay circuit $DC_{11}$ positioned at an end has its output terminal connected to the output node N10. The delay circuit $DC_{1W}$ positioned at the other end has its input terminal connected to the output terminal of an NAND gate 300. The NAND gate 300 serves to activate the oscillating circuit $OC_1$. One input terminal of the NAND gate 300 receives an enable signal ENA as an input used to activate the oscillating circuit $OC_1$. The other input terminal is connected to the output node N10.

When the enable signal ENA is activated (into an H level), the NAND gate 300 serves as an inverting circuit that inverts an input signal for output. On the other hand, the delay circuits $DC_{11}$ to $DC_{1W}$ each invert a received signal and outputs the inverted signal to the outside. More specifically, the delay circuits $DC_{11}$ to $DC_{1W}$ also serve as the inverting circuit as described above. Therefore, the oscillating circuit $OC_1$ includes an odd number of inverting circuits coupled in a ring shape (the NAND gate 300 and the delay circuits $DC_{11}$ to $DC_{1W}$ during activation).

Figure 4:
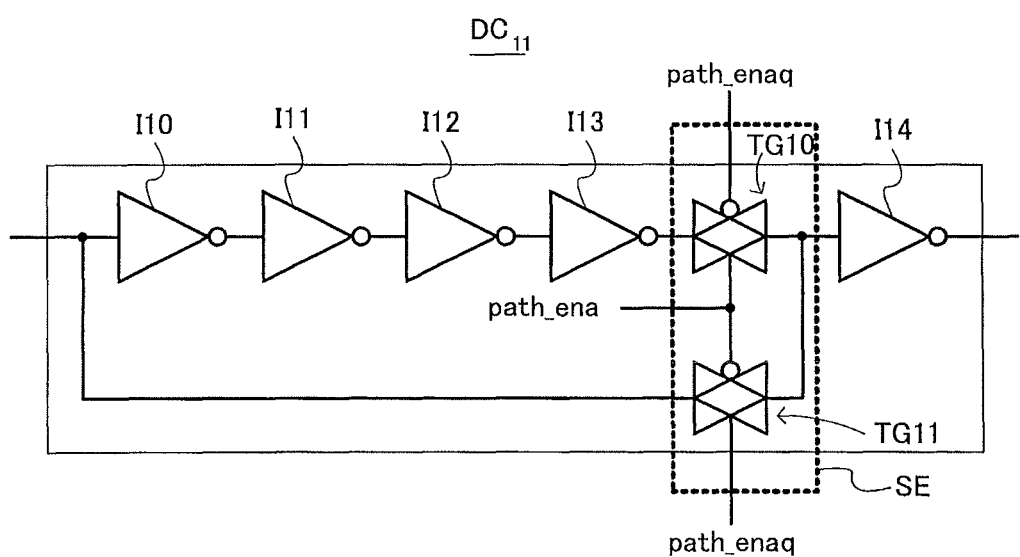
FIG. 4 is a circuit diagram of a delay circuit in FIG. 3.

FIG. 4 is a circuit diagram of the delay circuit $DC_{11}$. The delay circuit $DC_{11}$ includes a plurality of inverters I10 to I14 and a stage number selecting circuit SE that selects the number of stages of inverters. The stage number selecting circuit SE includes two transfer gates TG10 and TG11. The transfer gate TG10 turns on upon receiving an H level signal path_ena and an L level signal path_enaq. More specifically, when reference bit data D and search bit data CAM output from the corresponding unit data comparator circuit $UC_{11}$ do not match, the transfer gate TG10 turns on.

The transfer gate TG11 turns on upon receiving an L level signal path_ena and an H level signal path_enaq. More specifically, when the reference bit data D and the search bit data CAM match, the transfer gate TG11 turns on.

The plurality of inverters I10 to I14 are connected in series. The transfer gate TG10 is connected between the inverters I13 and I14. The transfer gate TG11 is connected between the input terminal of the inverter I10 and the input terminal of the inverter I14.

The stage number selecting circuit SE selects the number of stages of inverters based on a comparison result from a corresponding unit data comparator circuit $UC_{11}$. If the reference bit data D and the search bit data CAM match based on the result of comparison at the unit data comparator circuit $UC_{11}$, the transfer gate TG10 turns off and TG11 turn on. Therefore, an input signal at the delay circuit $DC_{11}$ is externally output through the single stage of inverter I14.

On the other hand, when the reference bit data D and the search bit data CAM are different, the transfer gate TG10 turns on and the TG11 turns off. Therefore an input signal to the delay circuit DC is externally output through five stages of inverters. More specifically, when the reference bit data D and the search bit data do not match, the delay time is prolonged.

In short, the delay circuit DC11 includes a path with less inverter stages (short path), a path with more inverter stages (long path), and the stage number selecting circuit that selects between the short path and the long path depending on the Hamming distance between reference bit data and search bit data.

The other delay circuits $DC_{12}$ to $DC_{1W}$ have the same configuration as that of the delay circuit $DC_{11}$. Therefore, in the oscillating circuit $OC_1$, as reference data with a W bit width stored in the storage circuit $S_1$ is more similar to search data with a W bit width, in other words, as the distance between the reference data and the search data is smaller, the number of stages of inverters is reduced. This is because the number of data unit comparator circuit $UC_{ij}$ that outputs an L level signal path_ena and an H level signal path_equ is relatively greater in this case. As the number of stages of inverters is reduced, the delay time is reduced. Therefore, the oscillating circuit $OC_1$ outputs a pulse signal $P_1$ with a high oscillating frequency.

On the other hand, as the distance between the reference data stored in the storage circuit $S_1$ and the search data is greater, the number of stages of inverters to be used in the oscillating circuit $OC_1$ increases. Therefore, the oscillating circuit $OC_1$ outputs a pulse signal $P_1$ with a low oscillating frequency.

As in the foregoing, the oscillating circuit $OC_1$ outputs a pulse signal $P_1$ with an oscillating frequency depending on the distance between the reference data in the storage circuit $S_1$ and search data. As the distance between the reference data and the search data is smaller, the oscillating circuit $OC_1$ reduces the number of stages of inverters to be used. Therefore, as the reference data is more similar to the reference data, a pulse signal $P_1$ with a higher oscillating frequency is output.

The oscillating circuits $OC_2$ to $OC_R$ have the same configuration as that of the oscillating circuit $OC_1$. Therefore, among the oscillating circuits $OC_1$ to $OC_R$, reference data that is the most similar to the search data is stored in a storage circuit $S_i$ corresponding to an oscillating circuit OCi that has output a pulse signal $P_i$ with the highest oscillating frequency.

The NAND gate 300 receives a signal on the node N10 and an enable signal ENA and outputs a result of NAND logical operation to the delay circuit $DC_{1w}$. As described above, the NAND gate 300 activates or stops the oscillating circuit $OC_1$ in response to the enable signal ENA. When the enable signal ENA is inactive (in an L level), the NAND gate 300 always outputs an H level signal. Therefore, the signal output from the oscillating circuit $OC_1$ is constantly in an H level. More specifically, the oscillating circuit $OC_1$ does not output a pulse signal.

WTA Circuit

The WTA circuit 20 receives pulse signals $P_1$ to $P_R$ from the oscillating circuits $OC_1$ to $OC_R$. The reference data (Winner) that is the most similar to search data is determined based on the oscillating frequencies of the pulse signals $P_1$ to $P_R$.

Figure 5:
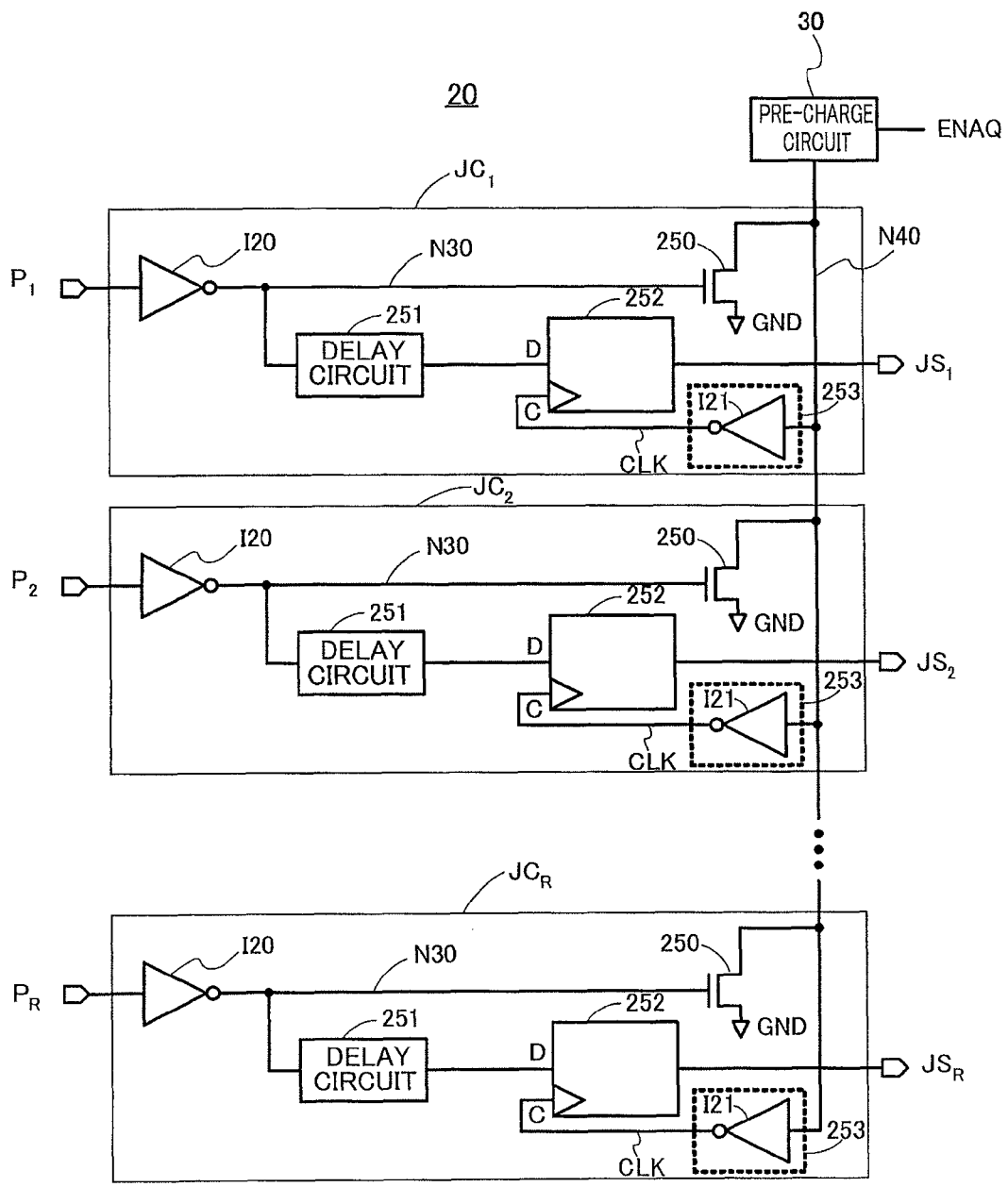
FIG. 5 is a circuit diagram of a WTA circuit in FIG. 1.

Referring to FIG. 5, the WTA circuit 20 includes a plurality of judgment circuits $JC_1$ to $JC_R$, a pre-charge circuit 30, and a latch instruction node N40. The judgment circuits $JC_1$ to $JC_R$ are each connected to the latch instruction node N40.

The pre-charge circuit 30 supplies the latch instruction node N40 with charge and charges the node upon receiving an enable signal ENAQ that is an inverted signal of the enable signal ENA. This causes voltage at the latch instruction node N40 to rise to an H level (VDD).

The judgment circuit $JC_1$ receives an output signal from the corresponding oscillating circuit $OC_1$. The judgment circuit $JC_2$ receives an output signal from the oscillating circuit $OC_2$. Similarly, the judgment circuits $JC_3$ to $JC_R$ receive output signals from the oscillating circuits $OC_3$ to $OC_R$, respectively.

The judgment circuit $JC_1$ includes an inverter I20, a delay circuit 251, a latch circuit 252, a discharge circuit 250, and a clock generator circuit 253.

An inverter I20 receives an output signal from the oscillating circuit $OC_1$ and inverts the received signal for output to a node N30. The discharge circuit 250 is made of an n-type MOS transistor. The n-type MOS transistor is connected between the latch instruction node N40 and a GND node to which ground voltage is supplied and has its gate connected to the node N30. The discharge circuit 250 discharges the latch instruction node N40 when an H level signal is input to the gate of the n-type MOS transistor. More specifically, the judgment circuit $JC_1$ lowers the voltage level at the latch instruction node N40 to the ground voltage level (L level) by the discharge circuit 250 upon receiving a pulse signal $P_1$.

The clock generator circuit 253 outputs a clock signal CLK when the latch instruction node N40 attains an L level. The clock generator circuit 253 is made of an inverter I21. The inverter I21 has its input terminal connected to the latch instruction node N40. The clock generator circuit 253 outputs an H level clock signal CLK when the latch instruction node N40 attains an L level.

The latch circuit 252 is made of a D flip-flop. The latch circuit 252 latches an output signal from the inverter I20 and externally outputs a judgment signal $JS_1$ upon receiving an H level clock signal CLK.

In response to a pulse signal $P_1$ output from the oscillating circuit $OC_1$, the delay circuit 251 makes such an adjustment that an inverted signal of the pulse signal $P_1$ is input to the latch circuit 252 when the clock generator circuit 253 outputs a clock signal. The delay circuit 251 however does not have to be provided.

The judgment circuits $JC_2$ to $JC_R$ each have the same configuration as that of the judgment circuit $JC_1$. The discharge circuit 250 and the clock generator circuit 253 each in judgment circuits $JC_1$ to $JC_R$ are both connected to the latch instruction node N40. Therefore, when the discharge circuit 250 of any of the judgment circuits JC discharges the latch instruction node N40, the clock generator circuits 253 of all the judgment circuits $JC_1$ to $JC_R$ output an H level clock signal CLK.

When a pulse is not formed in output signals from the oscillating circuits $OC_1$ to $OC_R$, in other words, before an oscillating circuit OCi outputs a pulse signal $P_i$, the pulse signals $P_1$ to $P_R$ are constantly in an H level. Now assume that among the oscillating circuits $OC_1$ to $OC_R$, the oscillating circuit $OC_2$ outputs a pulse signal $P_2$ with the highest oscillating frequency.

In this case, an output signal from the oscillating circuit $OC_2$ has its voltage level changed from an H level to an L level earlier than the outputs signals from the other oscillating circuits OCi. Therefore, the discharge circuit 250 in the judgment circuit $JC_2$ operates earliest among the discharge circuits 250 in the judgment circuits $JC_i$ and pulls the latch instruction node N40 to an L level.

At the time, the latch circuit 252 in the judgment circuit $JC_2$ receives an H level signal. However, the latch circuits 252 in the other judgment circuits $JC_1$ and JC3 to $JC_R$ receive an L level signal. When the latch instruction node N40 attains an L level, the clock generator circuits 253 in judgment circuits $JC_i$ each output an H level clock signal CLK at a time. Therefore, only the latch circuit 252 in the judgment $JC_2$ latches the H level signal and the latch circuits 252 in the other judgment circuits $JC_1$, and $JC_3$ to $JC_R$ each latch an L level signal.

Through the above described process, the judgment circuit $JC_2$ outputs an H level judgment signal $JS_2$ that indicates Winner and the other judgment circuits $JC_1$, and $JC_3$ to $JC_R$ output L level judgment signals $JS_1$, $JS_3$ to $JS_R$ that indicates Loser.

As in the foregoing, the associative memory 100 according to the embodiment generates a pulse signal with an oscillating frequency corresponding to the distance between reference data and search data. Then, reference data to be Winner is determined based on the oscillating frequency of a pulse signal.

When the distance between the reference data and the search data is converted into an oscillating frequency, erroneous search that would otherwise be caused because of varied characteristics using the conventional associative memory is less likely to take place. The oscillating circuit $OC_i$ includes a plurality of stages of inverters. If transistors that form inverters have varied characteristics, the plurality of stages of inverters reduce the effect of the varied characteristics. More specifically, if the transistors have varied characteristics, resulting oscillating frequencies can be less varied.

Figure 6:
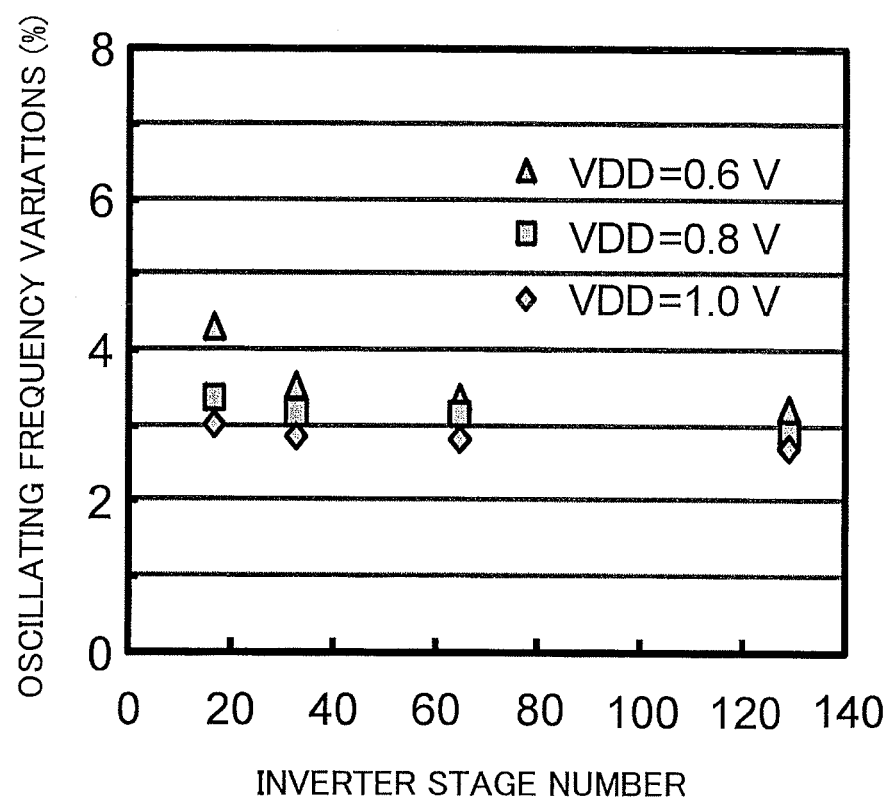
FIG. 6 is a graph showing a relation between the number of stages of inverters in the oscillating circuit shown in FIG. 3 and variations in the oscillating frequency.

FIG. 6 is a graph showing a relation between the number of stages of inverters in an oscillating circuit OCi and varied oscillating frequencies. The graph in FIG. 6 was obtained by the following method. To start with, oscillating circuits having 17 stages of inverters, 33 stages of inverters, 65 stages of inverters and 129 stages of inverters were produced. CMOS transistors used each had a gate length of 90 nm.

Pulse signals were generated using various kinds of power supply voltage in the produced oscillating circuits. Oscillating frequencies of the generated pulse signals were measured. The measured oscillating frequencies were normalized with respect to its average as 1, and a standard deviation was produced. The ordinate in FIG. 6 represents the standard deviation (%) of each of the oscillating circuits. As can be understood from FIG. 6, as the number of stages of inverters is greater, variations in the oscillating frequencies are reduced.

Second Embodiment

As described above, in the associative memory 100 according to the first embodiment, the WTA circuit 20 determines reference data to be Winner based on the oscillating frequencies of the pulse signals $P_1$ to $P_R$. Therefore, as the difference in the oscillating frequency between the pulse $P_i$ with the highest oscillating frequency and the pulse signal $P_i$ with the second highest oscillating frequency is greater, erroneous detection of Winner is less likely to occur.

Figure 7:
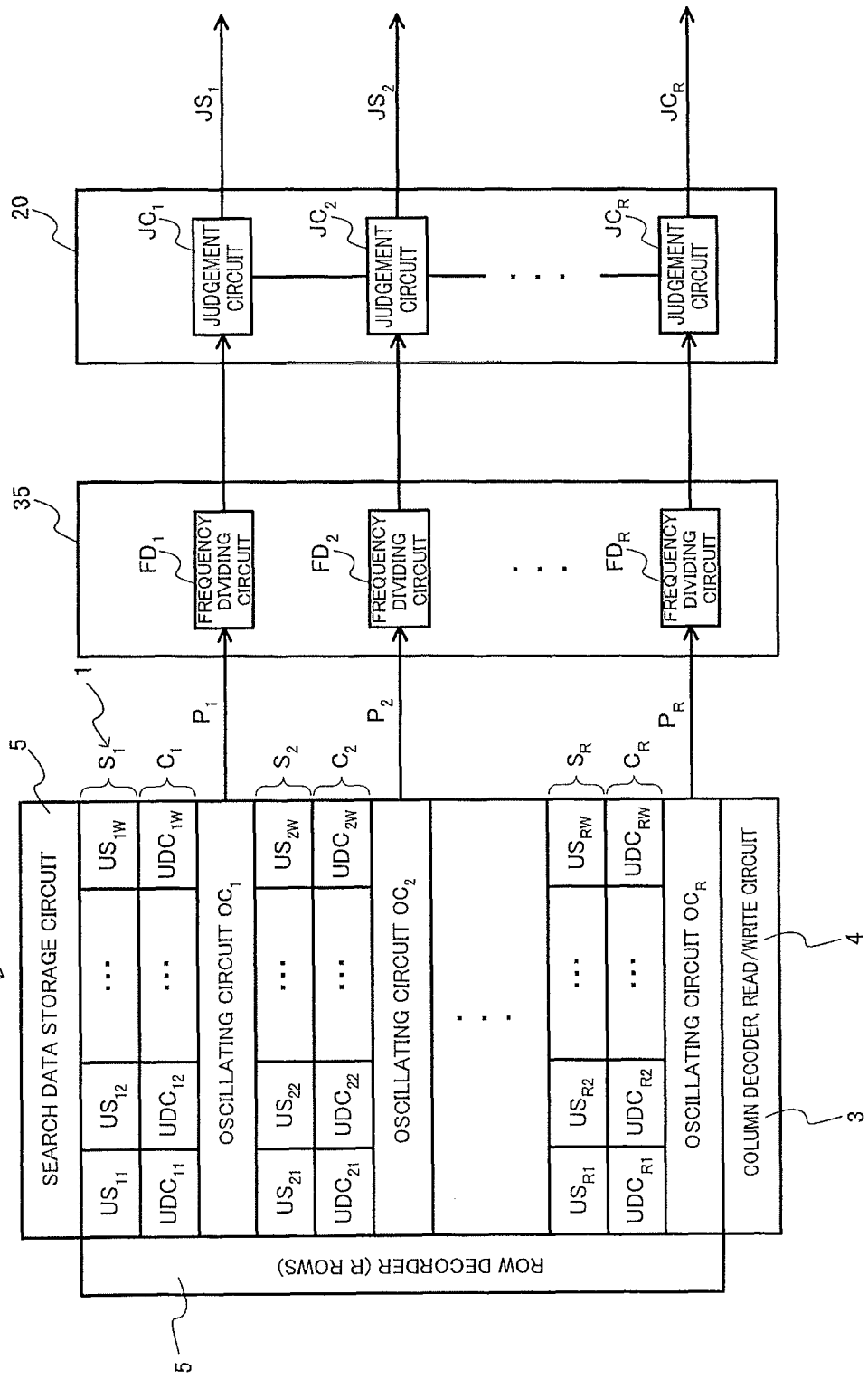
FIG. 7 is a functional block diagram of an overall structure of an associative memory according to a second embodiment of the present invention.

Referring to FIG. 7, an associative memory 110 according to the second embodiment includes a frequency dividing portion 35 between the memory portion 10 and the WTA circuit 20 in addition to the associative memory 100. The other structure of the associative memory 110 is the same as that of the associative memory 100.

The frequency dividing portion 35 includes a plurality of frequency dividers circuits $FD_1$ to $FD_R$. The other structure of the associative memory 110 is the same as that of the associative memory 100.

The frequency divider circuit $FD_1$ receives a pulse signal $P_1$ from the oscillating circuit $OC_1$. Then, the circuit frequency-divides the frequency of the pulse signal $P_1$ with a prescribed frequency dividing ratio. In this example, the frequency divider circuit $FD_1$ frequency-divides the pulse signal $P_1$ by 1.5. The frequency dividing ratio is however not limited to 1.5. The other frequency divider circuits $FD_2$ to $FD_R$ frequency divide the pulse signals $P_2$ to $P_R$ with the same ratio as that of the frequency divider circuit $FD_1$.

The judgment circuits $JC_1$ to $JC_R$ in the WTA circuit 20 receive frequency-divided pulse signals $P_1$ to $P_R$. The WTA circuit 20 determines Winner based on the frequency-divided pulse signals $P_1$ to $P_R$.

When the pulse signal $P_i$ is frequency-divided with a prescribed frequency-dividing ratio, the waveform change difference between the pulse signal $P_i$ with the highest oscillating frequency and the pulse signal $P_i$ with the second highest oscillating frequency can be increased. This will be described in conjunction with FIG. 8.

Figure 8:
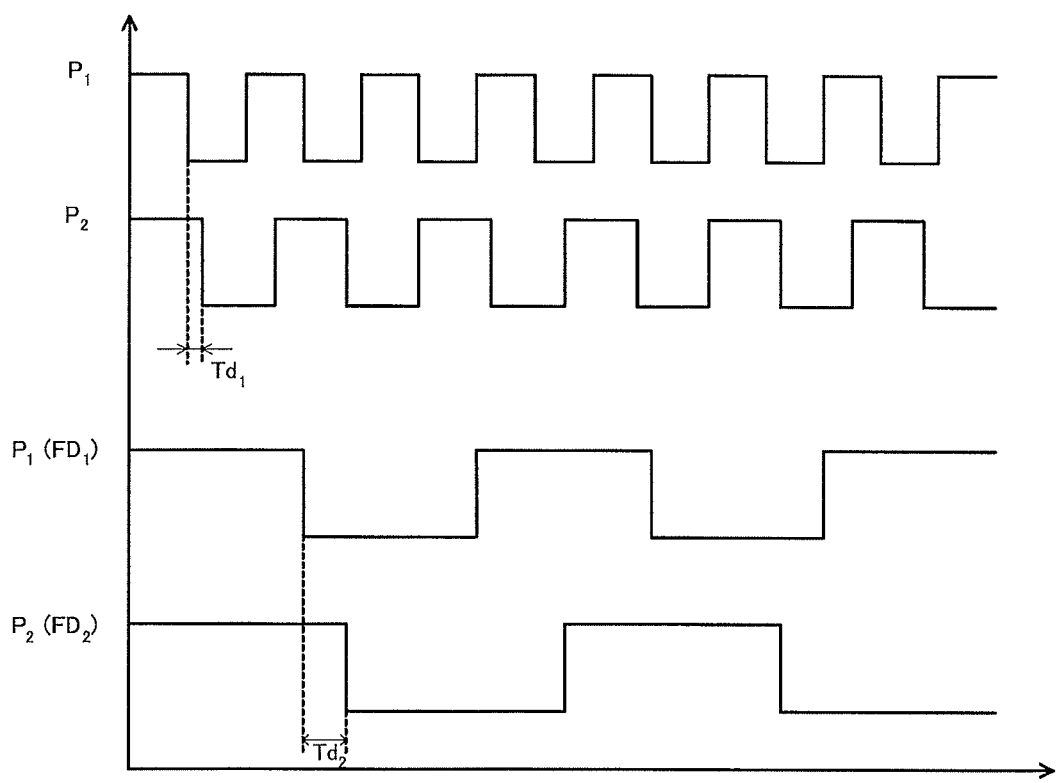
FIG. 8 is a chart for illustrating changes in the waveforms of pulse signals when a frequency divider circuit in FIG. 7 is used.

FIG. 8 is a waveform chart showing the waveforms of the pulse signals $P_1$ and $P_2$ when each frequency divider circuit $FD_i$ frequency-divides the pulse signal $P_i$ with a frequency dividing ratio of 1.5. In the chart, $P_1$ ($FD_1$) represents the pulse signal $P_1$ output from the frequency divider circuit $FD_1$. In the chart, $P_2$ ($FD_2$) represents the pulse signal $P_2$ output from the frequency divider circuit $FD_2$. In the chart, $P_1$ represents the pulse signal $P_1$ input to the frequency divider circuit $FD_1$ and $P_2$ represents the pulse signal $P_2$ input to the frequency divider circuit $FD_2$.

Here, assume that the pulse signal $P_1$ has the highest frequency and the pulse signal $P_2$ has the second highest frequency. As shown in FIG. 8, the time difference between the pulse signals $P_1$ and $P_2$ in initial waveform change before they are input to the frequency divider circuits is Td1.

On the other hand, the time difference between the frequency-divided pulse signals $P_1$ ($FD_1$) and $P_2$ ($FD_2$) in initial waveform change is Td2. The time difference Td2 is greater than the time difference Td1. In short, the frequency divider circuits $FD_1$ to $FD_R$ increases the time difference between initial waveform change in the pulse signal to be Winner and initial waveform change in the pulse signal with the second highest frequency. This allows the WTA circuit 20 to determine Winner more surely.

Third Embodiment

As shown in FIG. 5, in the WTA circuit 20 in the associative memory 100, all the judgment circuits $JC_1$ to $JC_R$ are connected to the one latch instruction node N40. The latch instruction node 40 in the WTA circuit 20 is long because it is connected to all the judgment circuits $JC_1$ to $JC_R$. Therefore, the latch instruction node N40 has a large load capacity. Therefore, it also takes long until the latch instruction node N40 has its voltage level pulled to the ground voltage after the n-type MOS transistor in the discharge circuit 250 is turned on. If it takes long to lower the voltage level at the latch instruction node N40, it takes long to determine Winner.

Figure 9:
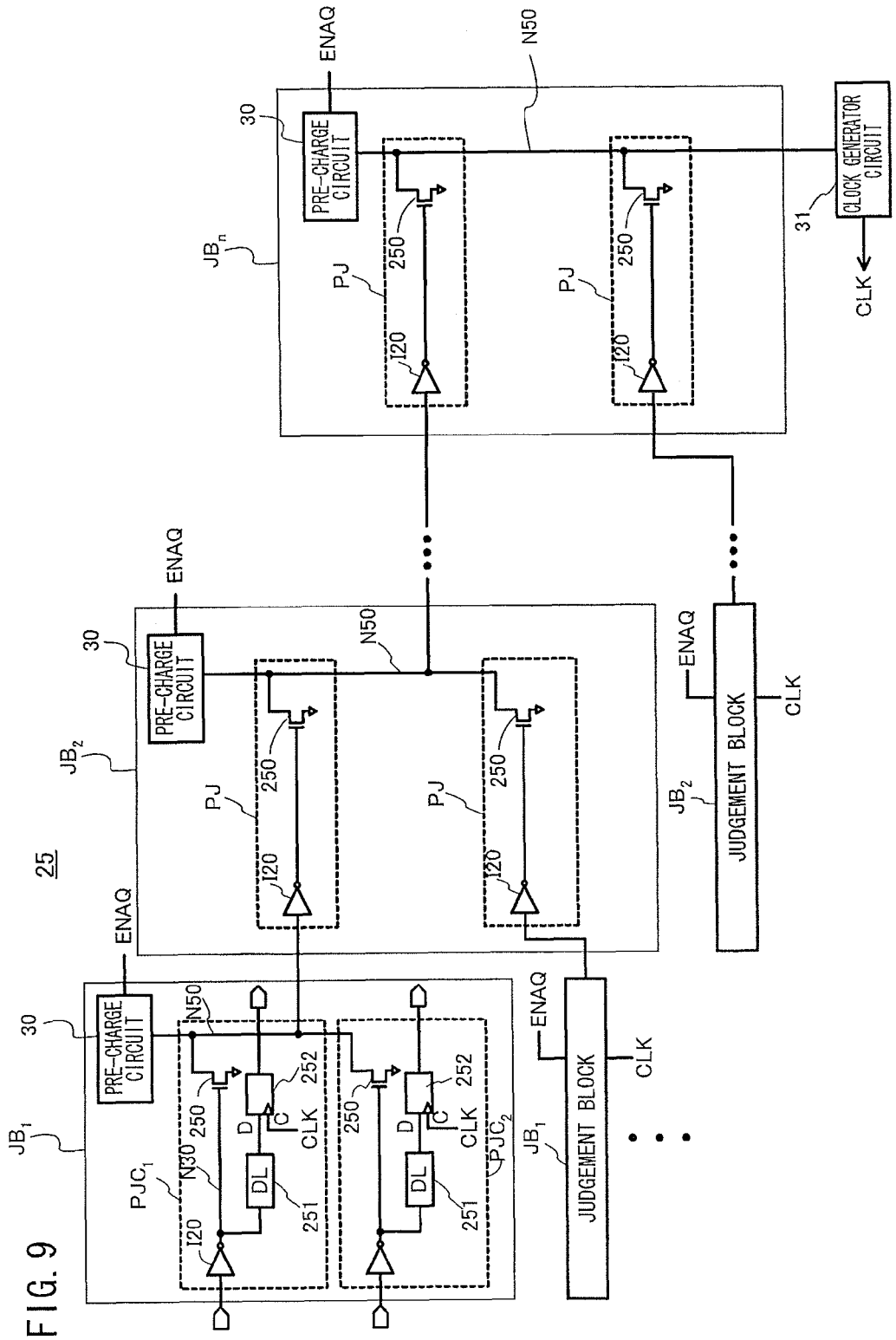
FIG. 9 is a circuit diagram of a WTA circuit in an associative memory according to a third embodiment of the present invention.

Therefore, an associative memory according to the present embodiment includes a new WTA circuit 25 shown in FIG. 9 instead of the WTA circuit 20. The other structure is the same as that of the associative memory 100.

Referring to FIG. 9, the WTA circuit 25 includes a plurality of judgment blocks JB. The plurality of judgment blocks JB are connected in a plurality of stages in a tournament manner. In FIG. 9, they are in an n-stage tournament arrangement from the first stage as the lowermost stage to the n-th stage as the uppermost stage (n; a natural number equal to or greater than 2).

A plurality of judgment blocks JB1 arranged in the first stage as the lowermost stage include R first pulse judgment circuits $PJC_1$ to $PJC_R$. Stated differently, the R first pulse judgment circuits $PJC_1$ to $PJC_R$ are divided into the plurality of judgment blocks JB1.

The judgment circuits JB1 each include less than R first pulse judgment circuits $PJC_i$ and a pulse reception judgment node N50. The first pulse judgment circuits $PJC_1$ to $PJC_R$ do not have the clock generator circuit 253 unlike the judgment circuits $JC_1$ to $JC_R$ in FIG. 5. The other structure is the same as that of the judgment circuits $JC_1$ to $JC_R$. The first pulse judgment circuits $PJC_1$ to $PJC_R$ receive pulse signals $P_1$ to $P_R$ from corresponding oscillating circuits $OC_1$ to $OC_R$.

Each of the judgment blocks JB1 further includes a pulse reception judgment node N50 and a pre-charge circuit 30. The pre-charge circuit 30 charges the pulse reception judgment node N50 upon receiving an enable signal ENAQ.

The pulse reception judgment node N50 is connected to a plurality of (less than R) first pulse judgment circuits $PJC_i$ included in the judgment block JB1. More specifically, the node is connected to a discharge circuit 250 in each of the first pulse judgment circuits $PJC_i$.

There are R judgment circuits $JC_i$ connected to the latch instruction node N40 in FIG. 5. In contrast, the number of first pulse judgment circuits $PJC_i$ connected to the latch instruction node N50 in FIG. 9 is less than R. The pulse reception judgment node N50 has a load capacity smaller than that of the latch instruction node N40.

Among the judgment blocks connected in the tournament manner, the structure of the judgment blocks JB2 to JBn-1 arranged in the second to the (n-1)-th stages will be described. Referring to FIG. 9, the plurality of judgment blocks JB2 arranged in the second stage each include a pre-charge circuit 30, a pulse reception judgment node N50, and a plurality of second pulse judgment circuits PJ.

The second pulse judgment circuits PJ are each connected to a pulse reception judgment node N50 in a corresponding judgment block JB1. The second pulse judgment circuit PJ includes an inverter I20 and a discharge circuit 250. The second pulse judgment circuit PJ is connected to the pulse reception judgment node N50 in the judgment block JB2 to which it belongs. More specifically, the discharge circuit 250 in the second pulse judgment circuit PJ is connected to the pulse reception judgment node N50. The pre-charge circuit 30 charges the pulse reception judgment node N50 upon receiving an enable signal ENAQ.

The judgment blocks JB arranged in the third to (n-1)-th stages each have the same structure. A second pulse judgment circuit PJ in a judgment block JB provided in the (n-1)-th stage is connected to a pulse reception judgment node N50 in a corresponding judgment block JB among a plurality of judgment blocks JB arranged in the preceding stage, i.e., the (n-2)-th stage.

One judgment block JBn is provided in the n-th stage as the uppermost stage. The judgment block JBn newly includes a clock generator circuit 31 in addition to the judgment block JB2. The other structure is the same as that of the judgment block JB2.

The clock generator circuit 31 outputs a clock signal CLK when the pulse reception judgment node N50 attains an L level. The internal configuration of the clock generator circuit 31 is the same as that of the clock generator circuit 253 in FIG. 5. In other words, the clock generator circuit 31 includes an inverter circuit I21.

As described above, the WTA circuit 25 includes judgment blocks JB1 to JBn connected in a plurality of stages including the first to the n-th stages in a tournament manner. The number of the first or second pulse judgment circuits connected to each of the pulse reception judgment node N50 is smaller than the number of judgment circuits connected to the latch instruction node N40 in FIG. 5. Therefore, the load capacity of each pulse reception judgment node N50 is smaller than that of the latch instruction node N40. Therefore, it takes a shorter period of time to lower the level at the pulse reception judgment node N50 from its H level to its L level than for the latch instruction node N40.

In short, the arrangement of the judgment blocks JB1 to JBn in the tournament manner allows the load capacity of the pulse reception judgment node N50 to be small. Therefore, the time after the pulse signal $P_i$ with the highest frequency is received in the judgment block JB1 until a clock signal CLK is output can be shortened. Stated differently, it takes less time to determine Winner.

Fourth Embodiment

According to the first embodiment, a delay circuit $DC_{ij}$ is provided for each data unit storage circuit $US_{ij}$. However, in such a configuration, a large number of transistor devices are necessary. Therefore, a single delay circuit may be arranged corresponding to a plurality of data unit storage circuits.

An associative memory according to the embodiment includes new oscillating circuits $OSC_1$ to $OSC_R$ in place of the oscillating circuits $OC_1$ to $OC_R$. The other structure is the same as that of the associative memory 100.

Figure 10:
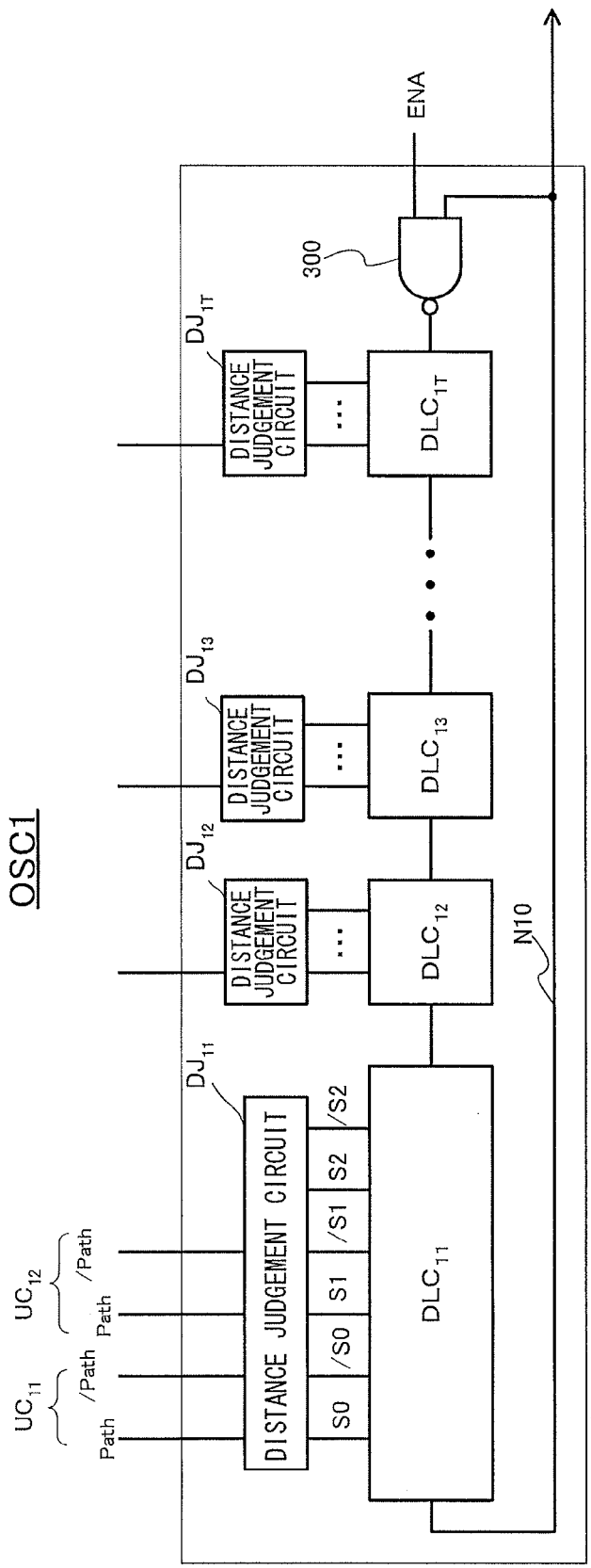
FIG. 10 is a functional block diagram of a configuration of an oscillating circuit in an associative memory according to a fourth embodiment of the invention.

Referring to FIG. 10, the oscillating circuit $OSC_1$ includes delay circuit $DLC_{11}$, $DLC_{12}$, ..., and $DC_{1T}$ (T: a natural number $\geq 1$) in place of delay circuits $DC_{11}$, $DC_{12}$, ..., $DC_{1W}$ and distance judgment circuits $DJ_{11}$ to $DJ_{1T}$ compared to the oscillating circuit $OC_1$. The distance judgment circuits $DJ_{11}$ to $DJ_{1T}$ correspond to the delay circuits $DLC_{11}$ to $DLC_{1T}$. The other structure is the same as that of the oscillating circuit $OC_1$.

An activated NAND gate 300 inverts an input signal. The delay circuits $DLC_{11}$ to $DLC_{1T}$ each invert an input signal. Therefore, the NAND gate 300 and the delay circuits $DLC_{11}$ to $DLC_{1T}$ serve as inverting circuits. More specifically, the oscillating circuit $OSC_1$ includes an odd number of inverting circuits. Therefore, there are an even number of delay circuits $DLC_{11}$ to $DLC_{1T}$. The odd number of inverting circuits (NAND gate 300 and the delay circuits $DLC_{11}$ to $DLC_{1T}$) are coupled in series in a loop shape.

The delay circuits $DLC_{11}$ to $DLC_{1T}$ each determine the oscillating frequency of a pulse signal $P_1$ based on comparison results by the two data unit comparator circuits $UC_{ij}$.

The distance judgment circuits $DJ_{11}$ to $DJ_{1T}$ receive comparison results from the two data unit comparator circuits $UC_{ij}$ (two signals path_ena and path_enaq). The Hamming distance is obtained based on these comparison results. Then, a signal corresponding to the obtained Hamming distance is output to corresponding delay circuits $DLC_{11}$ to $DLC_{1T}$.

More specifically, the distance judgment circuit $DJ_{11}$ receives comparison results from the unit data comparator circuits $UC_{11}$ and $UC_{12}$. If all reference bit data pieces D stored in the unit data storage circuits $US_{11}$ to $US_{12}$ match corresponding search bit data pieces CAM (in other words, if the Hamming distance equals zero), the distance judgment circuit $DJ_{11}$ outputs an H level signal S0. Then, L level signals $S_1$ and $S_2$ are output. Inverted signals /S0, /S1, and /S2 of the signals S0, S1 and S2 are output.

If one of the reference data pieces matches corresponding search bit data piece (in other words, if the Hamming distance equals one), the distance judgment circuit $DJ_{11}$ outputs an H level signal S1 and low level signals S0 and S2.

If none of the two reference bit data pieces matches corresponding search bit data (if the distance equal two), the distance judgment circuit $DJ_{11}$ outputs an H level signal S2 and L level signals S0 and S1.

As described above, the delay circuits $DLC_{11}$ to $DCL_{1T}$ and the NAND gate 300 are connected in series in a loop shape. Among the plurality of delay circuits $DLC_{11}$ to $DLC_{1T}$, the delay circuit $DLC_{11}$ positioned at an end has its output terminal connected to an output node N10. The delay circuit $DLC_{1T}$ positioned at the other end has its input terminal connected to the output terminal of the NAND gate 300.

Figure 11:
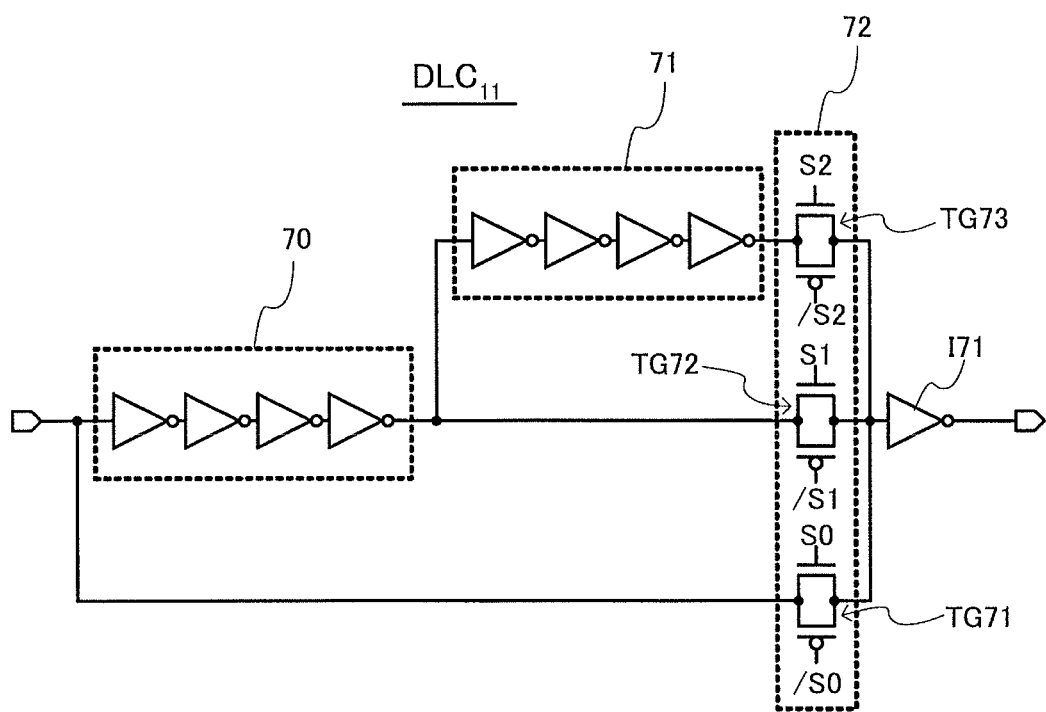
FIG. 11 is a circuit diagram of a delay circuit in FIG. 10.

The configuration of the delay circuit $DLC_{11}$ is shown in FIG. 11. The delay circuit $DLC_{11}$ includes a first delay stage

70, a second delay stage 71, an inverter I71, and a stage number selecting circuit 72. The stage number selecting circuit 72 includes transfer gates TG71, TG72 and TG73. The stage number selecting circuit 72 selects the number of stages of inverters to be used in response to signals S0 to S2 from the distance judgment circuit DJ$_{11}$. Stated differently, the stage number selecting circuit 72 selects delay time (oscillating frequency) in response to the Hamming distance.

The first and second delay stages 70 and 71 each include an even number of inverters connected in series. The first delay stage 70 receives an output from the delay circuit DLC$_{12}$ in the preceding stage and delays it. The second delay stage 71 receives an output from the first delay stage 70 and delays it.

Transfer gates TG71 to TG73 in the stage number selecting circuit 72 are connected in parallel. The transfer gates TG71 to TG73 are made of an n-type MOS transistor and a p-type MOS transistor. The transfer gate TG71 turns on upon receiving an H level output signal S0 and an L level output signal /S0 from a corresponding distance judgment circuit DJ$_{11}$. Here, the output signal /S0 is an inverted signal of the signal S0. In short, the transfer gate TG71 turns on if reference data stored in the data unit storage circuits US$_{11}$ and US$_{12}$ both match search data (if the distance equals zero). At the time, the delay circuit DLC$_{11}$ passes an input signal through the transfer gate TG71 for output to the inverter I71.

The transfer gate TG72 turns on upon receiving an H level signal S1 and an L level signal /S1 (an inverted signal of the signal S$_1$). More specifically, it turns on when the distance=1. At the time, the delay circuit DLC$_{11}$ supplies the first delay stage 70 with an input signal. Then, an output from the first delay stage 70 is supplied to the inverter I71.

The transfer gate TG73 turns on upon receiving an H level signal S2 and an L level signal/S2 (an inverted signal of the signal S2). More specifically, it turns on when the distance=2. At the time, the transfer gate TG13 supplies the inverter I71 with an output from the second delay stage 71.

In short, the oscillating circuit DLC$_{11}$ includes three paths (a short path with no delay stage, a middle path having the delay stage 71, and a long path having the delay stages 71 and 72) and the stage number selecting circuit 72 that selects one of the three paths. The paths are provided with different kinds of delay time. The oscillating circuit DLC$_{11}$ selects one of the three paths in response to a comparison result between two reference bit data pieces and search bit data piece. In the above-described example, when the distance=0, the delay circuit DLC$_{11}$ selects the short path. At the time, the number of stages of inverters to be used is one (the inverter I171 only). When the distance=1, the delay circuit DLC$_{11}$ selects the middle path. At the time, the number of stages of inverters is five (the first delay stage 70 plus the inverter I71). When the distance=2, the delay circuit DLC$_{11}$ selects the long path. At the time, the number of stages of inverters is nine (the first delay stage 70, the second delay stage 71 and the inverter I71).

Note that the delay circuits DLC$_{12}$ to DLC$_{1T}$ have the same structure as that of the delay circuit DLC$_{11}$.

As described above, the delay circuit DLC changes the number of stages of inverters depending on a plurality of comparison results. Therefore, the oscillating circuit DLC$_{11}$ can reduce the number of transistor devices to use in comparison with the oscillating circuit DC$_{11}$. Furthermore, when reference data and search data match (when the distance=0), the number of stages of inverters can be reduced. Therefore, a pulse signal with a higher frequency can be output. Consequently, the time required for the WTA circuit 20 to determine Winner can be shortened.

In the above-described example, the delay circuit DLC includes two delay stages and can set three kinds of delay time according to the number of delay stages to use. The delay circuit DLC selects the number of delay stages based on two comparison results obtained from two reference bit data pieces and two search bit data pieces. As a result, one of the three kinds of delay time is selected.

The delay circuit DLC can set delay time according to results of comparison between L (which is a natural number equal to or more than 2) pieces of reference bit data and search bit data. More specifically, the delay circuit DLC includes a plurality of delay stages and can set L+1 kinds of delay time according to the number of delay stages to use. The delay circuit DLC selects one kind of delay time (path) among L+1 kinds of delay time (paths) according to L results of comparison. A signal input to the delay circuit DLC is delayed by a selected kind of delay time and output to a delay circuit DLC in the next stage. In short, when L pieces of reference bit data and search bit data are compared, the delay circuit DLC includes L+1 paths. Different kinds of delay time are set for the paths.

Figure 12:
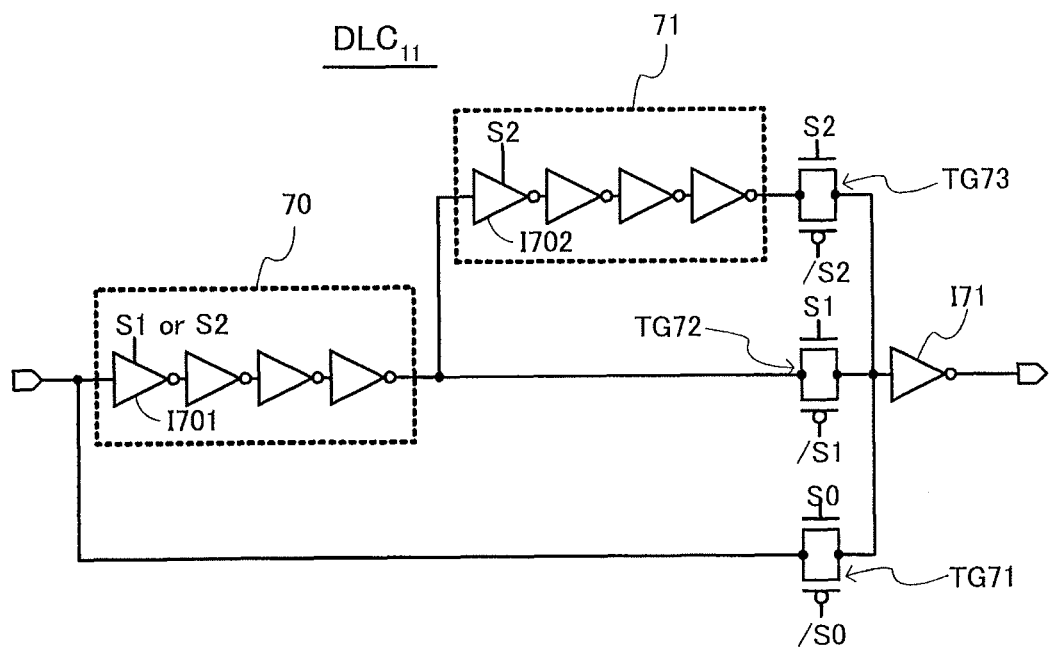
FIG. 12 is a circuit diagram of another delay circuit different from that in FIG. 11.

Note that as shown in FIG. 12, inverters in the first stage in each of the first delay stage 70 and the second delay stage 71 may be tri-state inverters. A tri-state inverter I701 is activated upon receiving an H level signal S1 or S2. A tri-state inverter I702 is activated upon receiving an H level signal S2. When the distance=0 the first and second delay stages 70 and 71 do not operate, and when=1 the second delay stage 71 does not operate, so that power consumption can be reduced.

Figure 13:
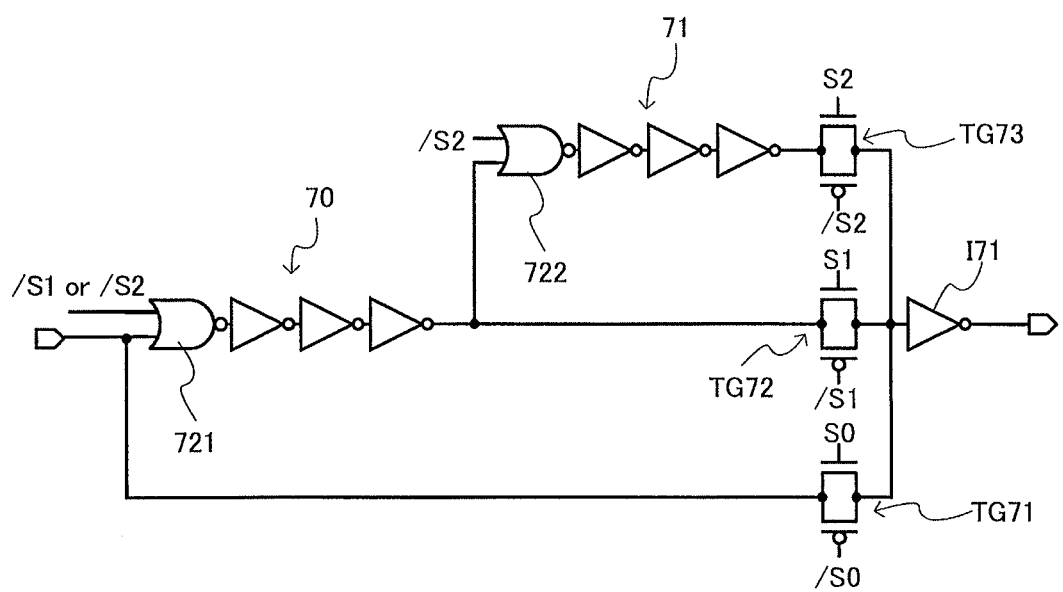
FIG. 13 is a circuit diagram of another delay circuit different from those shown in FIGS. 11 and 12.

When the tri-state inverters I701 and I702 are inactive, the input nodes of the inverters in the second stage in each of the delay stages 70 and 71 attain a floating state. Therefore, the node level fluctuates by the effect of noise or the like, which could cause the inverter to operate. As shown in FIG. 13, using NOR gates 721 and 722 in place of the tri-state inverters I701 and I702, the input nodes of the inverters in the second stage do not attain a floating state. Therefore, the inverters in the second stage and on can be prevented from operating by the effect of noise and the like.

The NOR gate 721 operates as an NOT gate (inverter) upon receiving an L level signal /S1 or /S2. The NOR gate 722 operates as an NOT gate upon receiving an L level signal /S2.

Figure 14:
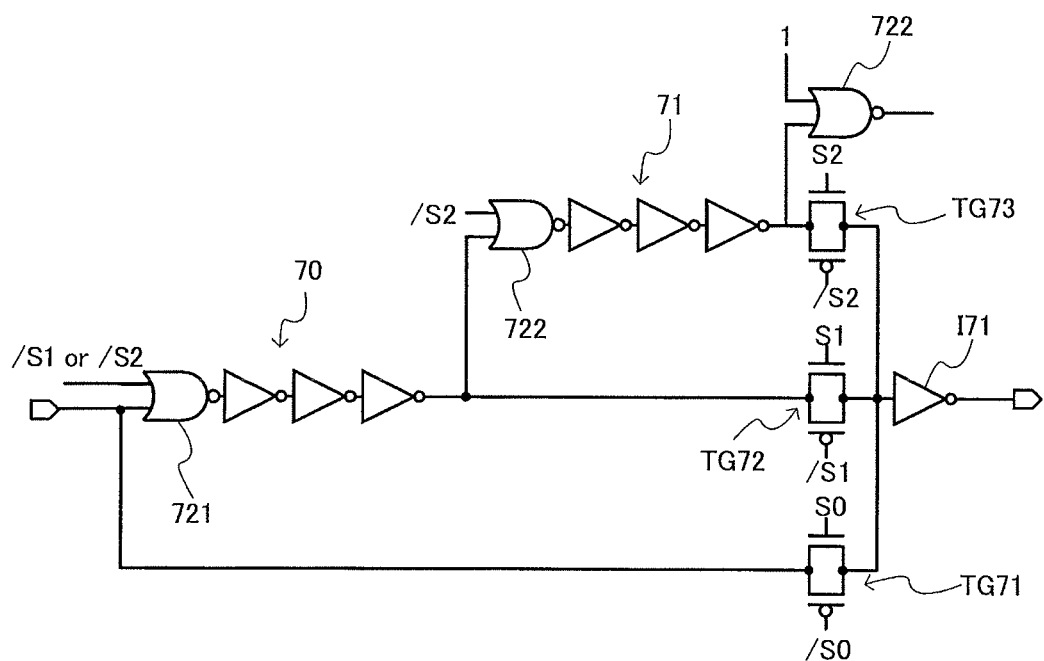
FIG. 14 is a circuit diagram of another delay circuit different from those in FIGS. 11 to 13.

Furthermore, as shown in FIG. 14, a dummy NOR gate 722 may be provided between the second delay stage 71 and the transfer gate TG73. In this way, the capacitances according to lines for each path can be equalized. Therefore, delay circuits for the paths can have the same design during designing.

Fifth Embodiment

The above-described associative memory 100 searches for the most similar reference data to search data. However, it is preferable to search for a plurality of similar data pieces to search data in some cases.

Figure 15:
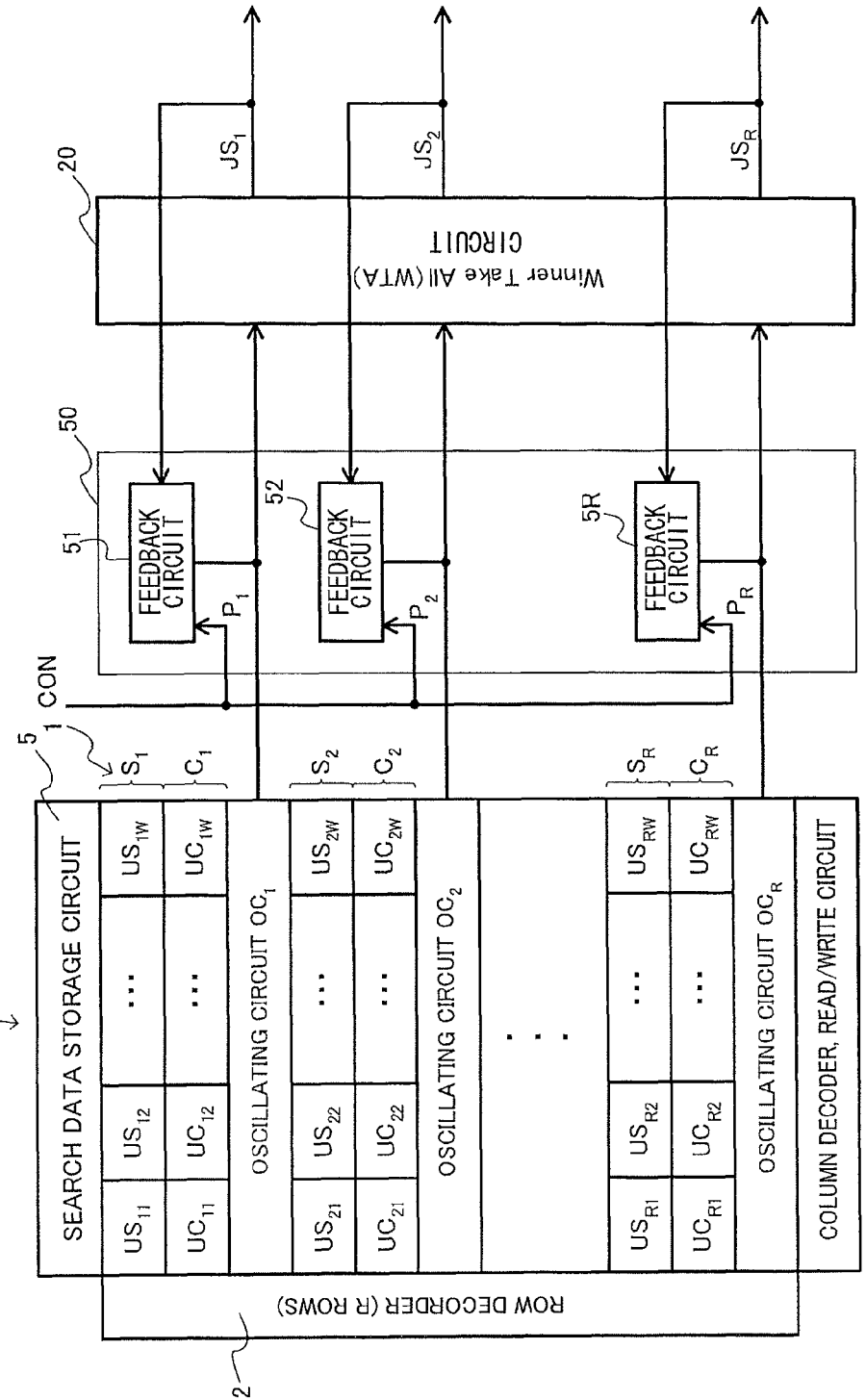
FIG. 15 is a functional block diagram of an overall structure of an associative memory according to a fifth embodiment of the present invention.

Referring to FIG. 15, an associative memory 200 according to this embodiment includes a new feedback circuit 50 in addition to the associative memory 100. The other structure is the same as that of the associative memory 100.

The feedback circuit 50 includes a plurality of feedback circuits 51 to 5R. The feedback circuits 51 to 5R are each activated upon receiving a control signal CON.

The feedback circuit 51 outputs an H level feedback signal upon receiving an H level judgment signal JS$_1$. The output node of the oscillating circuit OC$_1$ is charged upon receiving the H level feedback signal. More specifically, the feedback circuit 51 charges the output node of the oscillating circuit OC$_1$ upon receiving the H level judgment signal JS$_1$. Therefore, the output signal of the oscillating circuit OC$_1$ is fixed at the H level. If a pulse signal P$_1$ is output, it is invalidated.

The feedback circuit 51 does not charge the output node of the oscillating circuit $OC_1$ when the judgment signal $JS_1$ is in an L level. However, once the judgment signal $JS_1$ attains an H level, the circuit continues to supply the output node of the oscillating circuit $OC_1$ with an H level feedback signal thereafter.

Similarly, the feedback circuits 52 to 5R do not charge the output nodes of the oscillating circuits $OC_2$ to $OC_R$ until corresponding judgment signals $JS_2$ to $JS_R$ attain an H level. However, once the judgment signals $JS_2$ to $JS_R$ attain an H level, the circuit continues to charge the outputs nodes of the oscillating circuits $OC_2$ to $OC_R$ thereafter.

The associative memory 200 having the above-described structure operates as follows.

The associative memory 200 initiates first search to start with. At the time, the associative memory 200 searches for reference data that is the most similar to search data.

First, search data is input to each of the comparator circuits $C_1$ to $C_R$. Then, an enable signal ENA attains an H level, which starts the operation of the oscillating circuits $OC_1$ to $OC_R$. Now, assume that reference data stored in the storage circuit $S_2$ is the most similar data to the search data. In this case, a judgment signal $JS_2$ attains an H level, and the other judgment signals $JS_1$ and $JS_3$ to $JS_R$ attain an L level.

The feedback circuits 51 to 5R are activated upon receiving a control signal CON. The feedback circuit 52 charges the output node of the oscillating circuit $OC_2$ upon receiving the H level judgment signal $JS_2$. As a result, the voltage level at the output node of the oscillating circuit $OC_2$ is maintained in an H level. Therefore, a pulse signal $P_2$ output from the oscillating circuit $OC_2$ is invalidated.

When the first search is complete, the enable signal ENA input to the oscillating circuits $OC_1$ to $OC_R$ is inactivated (pulled to an L level).

Then, the associative memory 200 carries out the second search. At the time, the enable signal ENA attains an H level again. The oscillating circuits $OC_1$ to $OC_R$ output pulse signals $P_1$ to $P_R$ based on the same comparison result as the result for the first search.

The output node of the oscillating circuit $OC_2$ is however kept in the H level by the feedback circuit 52. Therefore, the pulse signal $P_2$ is invalidated, so that the output signal of the oscillating circuit $OC_2$ is kept in the H level. Therefore, the WTA circuit 20 determines reference data that is the most similar to the search data based on the signals $P_1$ and $P_3$ to $P_R$ other than the pulse signal $P_2$. Now assume that reference data stored in the storage circuit $S_1$ is the most similar data to the search data. In this case, the judgment signal $JS_1$ attains an H level and the signals $JS_2$ to $JS_R$ attain an L level.

Reference data corresponding to the signal $JS_1$ that has attained an H level by the second search (in other words, the reference data stored in the storage circuit $S_1$) corresponds to the reference data that is the second most similar to the search data.

When the judgment signal $JS_1$ attains an H level, the feedback circuit 51 charges the output node of the oscillating circuit $OC_1$. In short, the feedback circuit 51 invalidates the pulse signal $P_1$ of the oscillating circuit $OC_1$. During the third search, the oscillating circuits $OC_1$ and $OC_2$ cannot output a pulse signal. Therefore, reference data that is the most similar to the search data is searched among the reference data other than the reference data that has already been subjected to the searches (the reference data in the storage circuit $S_1$ and $S_2$). The reference data found by the search corresponds to the third most similar data to the search data.

As in the foregoing, In the j-th search (j is an integer that satisfies $1<j \leq k$, and k is an integer $\geq 2$), the associative memory 200 invalidates outputs from the oscillating circuits $OC_i$ corresponding to the judgment circuits $JC_i$ that have output an H level judgment signal $JS_i$ until the (j−1)-th search. In this way, every time search processing is carried out, reference data similar to search data can be found in the order of degrees of similarity to the search data.

Sixth Embodiment

The associative memory 200 according to the fifth embodiment can search for a plurality of reference data pieces in the order of degrees of similarity to the search data by invalidating the output of the oscillating circuit $OC_i$ using the feedback circuit 50. However, only one reference data piece can be searched for by one search processing. Therefore, when a plurality of pieces of reference data similar to the search data are searched for, the search processing must be carried out as many times as the number of necessary reference data pieces.

Figure 16:
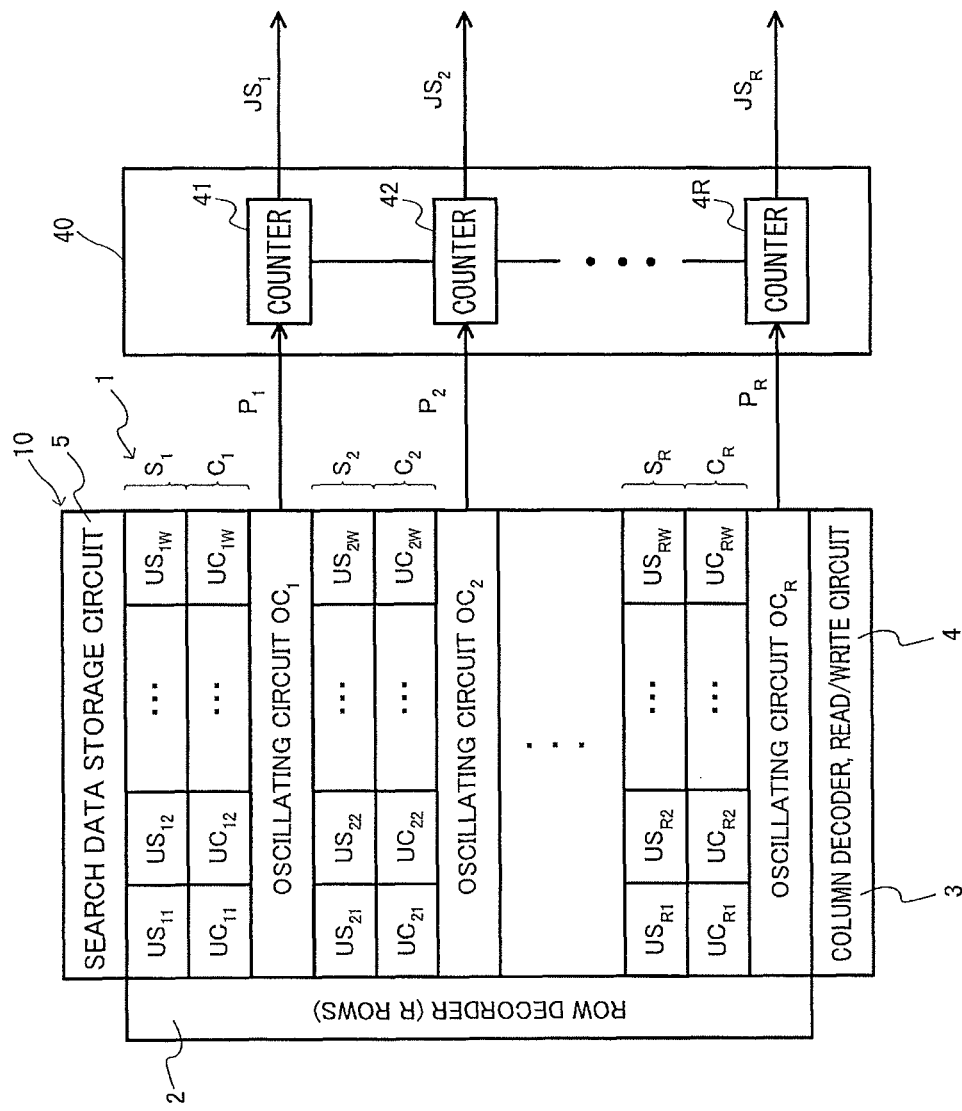
FIG. 16 is a functional block diagram of an overall structure of an associative memory according to a sixth embodiment of the present invention.

FIG. 16 is a functional block diagram of an associative memory 300 according to the embodiment. Referring to FIG. 16, the associative memory 300 includes a counter portion 40 instead of the WTA circuit 20 when it is compared to the associative memory 100.

The counter portion 40 includes a plurality of counter circuits 41 to 4R. The counter circuit 41 receives a pulse signal $P_1$ from the oscillating circuit $OC_1$ and counts the pulses of the pulse signal $P_1$. If the count number reaches a prescribed number CT (such as 10), the count circuit 41 outputs an H level judgment signal $JS_1$.

Similarly, the counter circuits 42 to 4R receive pulse signals $P_2$ to $P_R$ from the oscillating circuits $OC_2$ to $OC_R$, respectively and then count the pulses of the pulses signals $P_2$ to $P_R$. When the count number reaches a prescribed number CT, the counter circuits 42 to 4R sequentially output H level judgment signals $JS_2$ to $JS_R$.

As described above, the oscillating circuits $OC_1$ to $OC_R$ raise the oscillating frequencies of the pulse signals $P_1$ to $P_R$ as corresponding reference data pieces are more similar to the search data. As the oscillating frequencies of received pulse signals $P_1$ to $P_R$ are higher, the counter circuits 41 to 4R output H level judgment signals $JS_1$ to $JS_R$ earlier. In the other words, the judgment signals $JS_1$ to $JS_R$ rise to H level sequentially in the order of the degrees of how corresponding reference data is similar to the search data. The counter portion 40 can determine reference data in the order of degrees of similarity to the search data based on the order of output of the H level judgment signals $JS_1$ to $JS_R$.

As in the foregoing, the associative memory 300 can search for a plurality of pieces of reference data that are similar to search data by single search processing.

Seventh Embodiment

In the above-described embodiments, the Hamming distance is applied to the associative memory. However, the associative memory according to the present invention can also be applied with the Manhattan distance.

Figure 17:
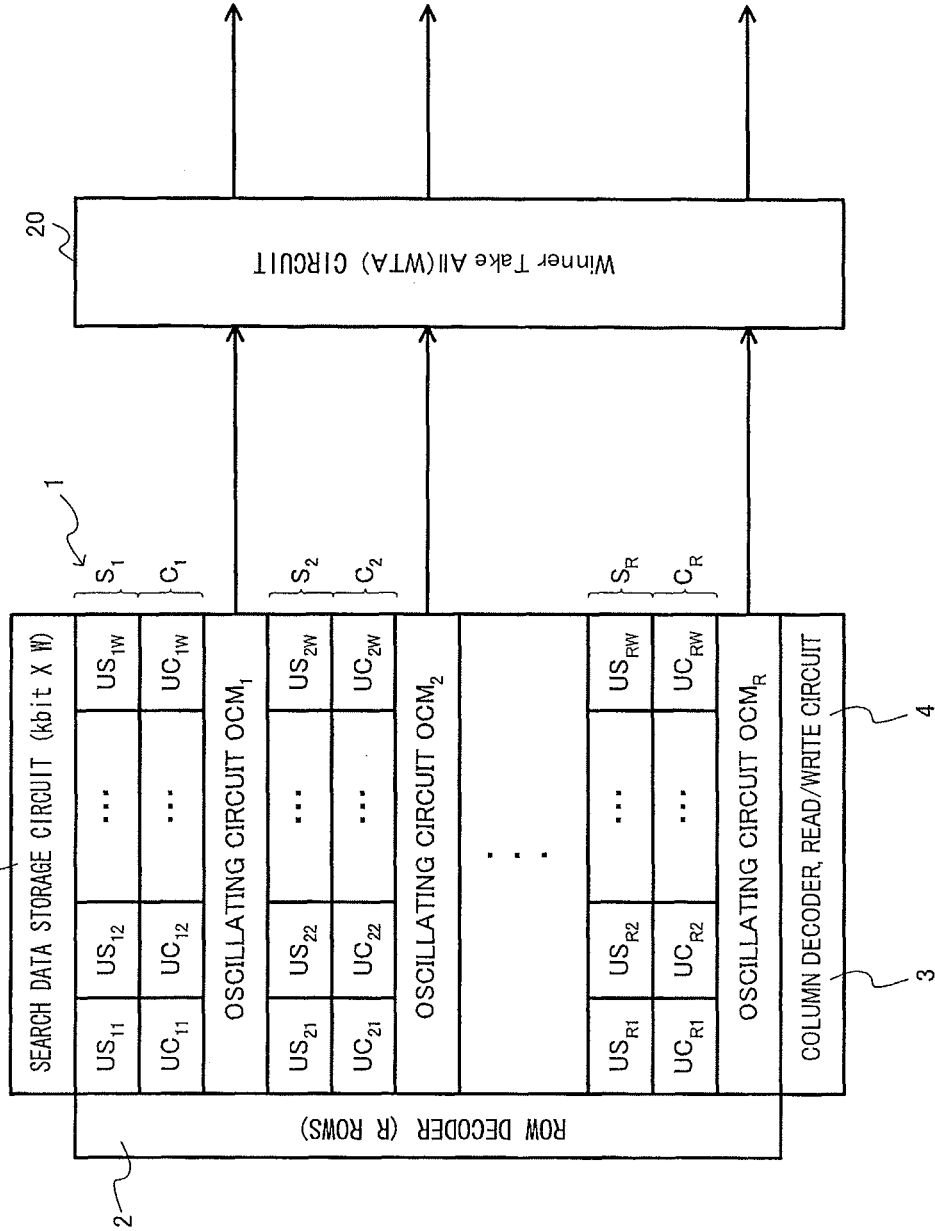
FIG. 17 is a functional block diagram of an overall structure of an associative memory according to a seventh embodiment of the present invention.

Referring to FIG. 17, an associative memory 400 includes a memory array portion 10 and a WTA circuit 20 similarly to the associative memory 100.

The memory array portion 10 includes a memory portion 1, a row decoder 2, a column decoder 3, a Read/Write circuit 4, and a search data storage circuit 5 similarly to FIG. 1.

The unit data storage circuits $US_{11}$ to $US_{1W}$, $US_{21}$ to $US_{2W}$, ..., and $US_{R1}$ to $US_{RW}$ in the memory portion 1 each store reference data on a K-bit basis.

Now, assume that a unit data storage circuit $US_{ij}$ ($1 \le j \le W$) is arranged in the i-th row ($1 \le i \le R$). Among reference data $REF_i$ stored in the storage circuit $S_i$ in the i-th row, data stored in the unit data storage circuit $US_{ij}$ is reference data $REF_{ij}$. More specifically, reference data $REF_i$ stored in the i-th row includes data $REF_{i1}, REF_{i2}, \ldots REF_{ij}, \ldots$, and $REF_{iw}$. Search data input from the outside is data SW. The search data SW includes data $SW_1, SW_2, \ldots SW_j, \ldots$, and $SW_w$.

The Manhattan distance between the search data SW and reference data $REF_i$ is indicated by the following expression (1):

$$D_{Manh,i} = \sum_{j=1}^{w} |SWj - REFij| \quad (1)$$

As described above, the unit data storage circuit $US_{ij}$ stores k-bit reference data $REF_{ij}$. Therefore, the unit data storage circuit $US_{ij}$ includes k storage circuits (such as SRAM devices). The storage circuits each store reference bit data in each digit position of the reference data $REF_{ij}$ (reference bit data in the first digit position to reference bit data in the most significant digit (k-th digit) position).

The unit data comparator circuit $UC_{ij}$ calculates the Manhattan distance between the reference data $REF_{ij}$ (k bits) stored in a corresponding unit data storage circuit $US_{ij}$ and search data $SW_j$ (k bits).

Figure 18:
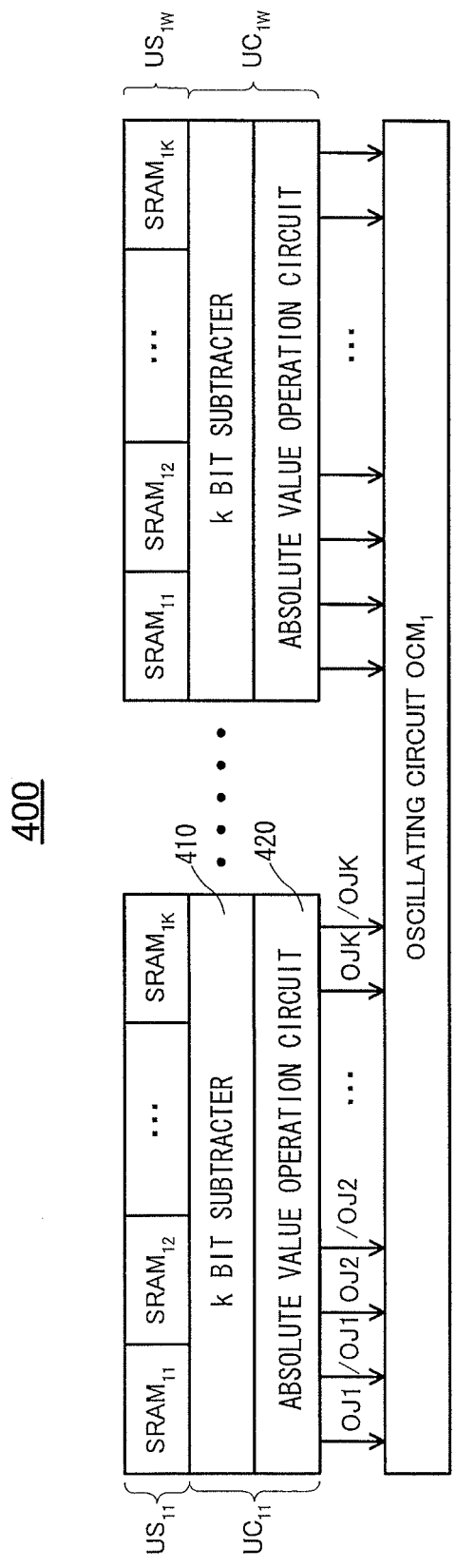
FIG. 18 is a functional block diagram of a structure of a storage circuit, a comparator circuit, and an oscillating circuit in the first row in the memory array portion in FIG. 17.

FIG. 18 is a functional block diagram showing a unit data storage circuit, a unit data comparator circuit, and an oscillating circuit arranged in the first row (i=1).

The unit data storage circuit $US_{11}$ includes K storage circuits $SRAM_{11}$ to $SRAM_{1K}$. The storage circuit $SRAM_{11}$ stores reference bit data in the first digit position of the reference data $REF_{11}$. Similarly, the storage circuit $SRAM_{1K}$ stores reference bit data in the K-th digit position of the reference data $REF_{11}$.

The unit data comparator circuit $UC_{11}$ includes a K bit subtracter 410 and an absolute value operation circuit 420. The K bit subtracter 410 and the absolute value operation circuit 420 calculate the absolute value of the difference between the search data $SW_1$ and the reference data $REF_{11}$.

More specifically, the K bit subtracter 410 obtains the difference between reference bit data in the first digit position of the reference data $REF_{11}$ and search bit data in the first digit position of the search data $SW_1$. The absolute value operation circuit 420 converts the differential value into an absolute value and outputs the value as output signals OJ1 and /OJ1. The output signal /OJ1 is an inverted signal of the output OJ1.

Similarly, the K bit subtracter 410 obtains the difference between reference bit data in the second digit position of the reference data $REF_{11}$ and search bit data in the second digit position of the search data $SW_1$. The absolute value operation circuit 420 converts the differential value into an absolute value and outputs the result as output signals OJ2 and /OJ2. The K bit subtracter 410 and the absolute value operation circuit 420 carry out calculation about bit data in the third digit position and on of the reference data $REF_{11}$ in the same manner and output signals OJ3 to OJK and /OJ3 to /OJK.

Comparison results (output signals OJ1 to OJK multiplied by W) between the reference data $REF_{11}$ to $REF_{1W}$ stored in the data unit storage circuits $US_{11}$ to $US_{1W}$ in the same first row and search data $SW_1$ to $SW_w$ are all input to the same oscillating circuit $OCM_1$.

The oscillating circuit $OCM_1$ determines an oscillating frequency for a pulse signal $P_1$ to be output based on a comparison result by the comparator circuit $C_1$, in other words in response to the obtained Manhattan distance between the reference data $REF_1$ and the search data SW.

Figure 19:
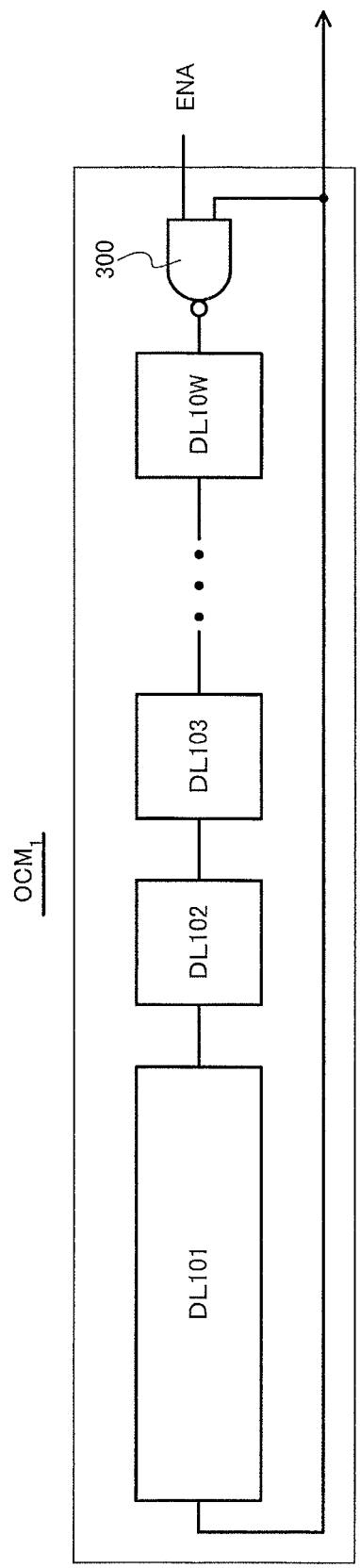
FIG. 19 is a functional block diagram of a structure of the oscillating circuit in FIG. 18.

FIG. 19 is a functional block diagram of the oscillating circuit $OCM_1$. The oscillating circuit $OCM_1$ includes an even number of delay circuits DL101 to DL10W and a NAND gate 300. The even number of delay circuits DL101 to DL10W and the NAND gate 300 function as an inverting circuit that inverts an input signal in operation. Therefore, the oscillating circuit $OCM_1$ includes a plurality of inverting circuits coupled in series in a loop shape. The output of the delay circuit DL101 is output externally and input to the NAND gate 300 as well. More specifically, the delay circuits DL101 to DL10W and the NAND gate 300 form a ring oscillator.

The delay circuit DL 101 corresponds to the data unit storage circuit $US_{11}$. The delay circuit DL102 corresponds to the data unit storage circuit $US_{12}$. Hereinafter, the delay circuits DL103 to DSL10W correspond similarly to the data unit storage circuit $US_{13}$ to $US_{1W}$, respectively.

Figure 20:
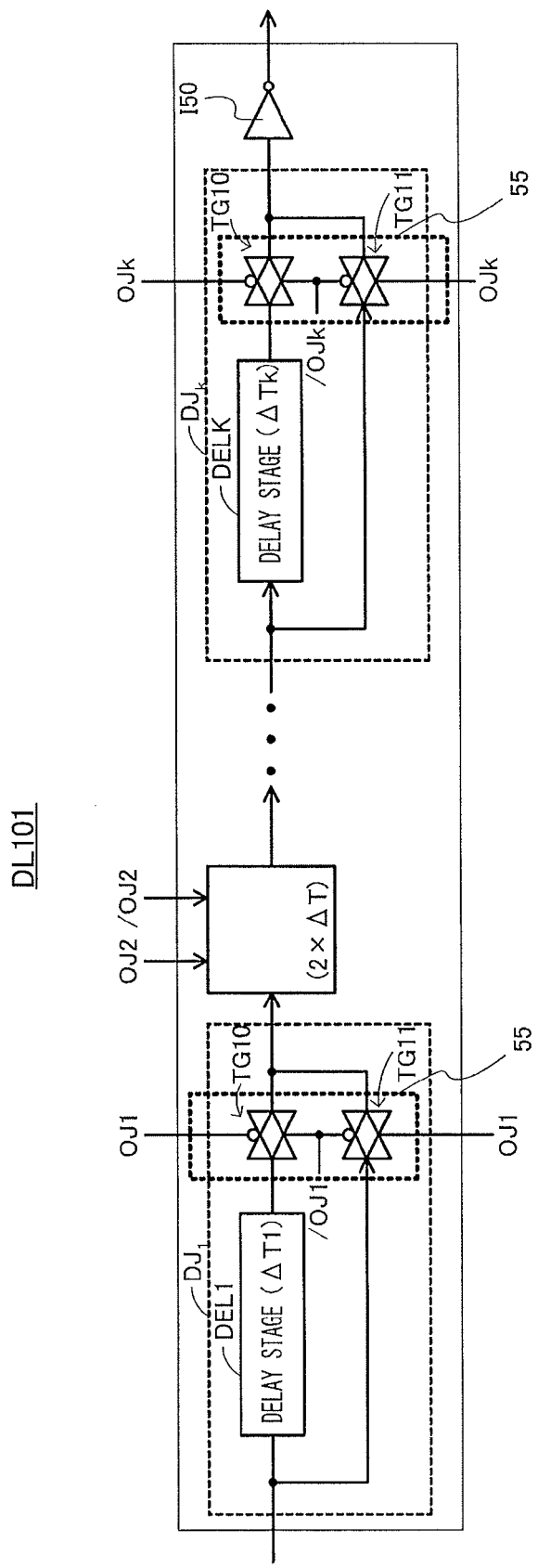
FIG. 20 is a functional block diagram of a structure of a delay circuit in FIG. 19.

FIG. 20 shows the configuration of the delay circuit DL101. The delay circuit DL101 includes a plurality of delay circuits $DJ_1$ to $DJ_K$ and an inverter I50. The delay circuits $DJ_1$ to $DJ_K$ and the inverter I50 are connected in series.

The delay circuit $DJ_1$ includes a delay stage DEL1 and a stage number selecting circuit 55. The delay stage DEL1 includes a plurality of inverters connected in series. The delay circuit $DJ_1$ selects the number of stages of inverters to be used in response to an output signal OJ1. Stated differently, the delay circuit $DJ_1$ selects whether or not to use the delay stage DEL1 in response to the signal OJ1.

The distance judgment circuit $DJ_1$ receives an output from the delay circuit DL102 and obtains the distance of the reference bit data in the first digit position in the reference data $REF_{11}$ stored in the unit data storage circuit $US_{11}$ based on the signals OJ1 and /OJ1 output from the unit data comparator circuit $UC_{11}$. When the reference bit data in the first digit position of the reference data $REF_{11}$ matches search bit data in the first digit position of the search data $SW_1$, the signal OJ1 attains an H level and the signal /OJ1 attains an L level. On the other hand, when reference bit data in the first digit position of the reference data $REF_{11}$ does not match the search bit data in the first digit position of the search data $SW_1$, the signal OJ1 attains an L level and the signal /OJ1 attains an H level.

The stage number selecting circuit 55 includes transfer gates TG10 and TG11. The transfer gates TG10 and TG11 are connected in parallel. The delay stage DEL1 is connected between an input terminal of the delay circuit $DJ_1$ and the transmission gate TG10.

When the reference bit data in the first digit position of the reference data $REF_{11}$ matches the search bit data in the first digit position of the search data $SW_1$, the transfer gate TG11 turns on and the transfer gate TG10 turns off. In this case, an input signal passes through the transfer gate TG11 without passing through the delay stage DEL1 and output to the outside.

On the other hand, when the reference bit data in the first digit position of the reference data $REF_{11}$ does not match the search bit data in the first digit position of the search data $SW_1$, the transfer gate TG10 turns on. In this case, an input signal is delayed by delay time $\Delta T1$ set at the delay stage DEL1 and output externally.

In short, the delay circuit $DJ_1$ can set two kinds of delay time and selects the longer delay time of the two kinds of delay time when the reference bit data and the search bit data are different.

The delay circuits $DJ_2$ to $DJ_K$ operate similarly to the delay circuit $DJ_1$. The delay circuits $DJ_2$ to $DJ_K$ can set two kinds of delay time and select one of the two kinds of delay time in response to a comparison result between the reference bit data and the search bit data. Therefore, the delay circuit DL101 can set $2^K$ kinds of delay time based on a comparison result between k bit reference bit data and k bit search bit data. Stated differently, the delay circuit DL101 includes $2^k$ different kinds of delay time and select a path in response to the Manhattan distance between k pieces of reference bit data and k pieces of search bit data.

Delay time at the delay stage in the delay circuit $DJ_2$ is twice as long as that of the delay stage $DEL_1$. More specifically, every time the digit is shifted up, the delay time $\Delta T$ is set longer. In this way, as the digit is closer to the most significant bit, the delay time is prolonged. More specifically, as the Manhattan distance increases, the delay time is prolonged.

The delay circuits DL102 to DL10W have the same configuration as that of the delay circuit DL101 and operates in the same manner. Therefore, the oscillating circuit $OCM_1$ outputs a signal with an oscillating frequency according to the Manhattan distance between the reference data and the search data stored in the storage circuit S1. More specifically, as the Manhattan distance between the reference data and the search data is shorter, a signal with a higher oscillating frequency is output.

The foregoing description is about the structure and operation of the storage circuit $S_1$, the comparator circuit $C_1$ and the oscillating circuit $OCM_1$ in the first row. The structure and operation of the storage circuits $S_2$ to $S_R$, the comparator circuits $C_2$ to $C_R$, and the oscillating circuits $OCM_2$ to $OCM_R$ in the second row and on are the same as those of the storage circuit $S_1$, the comparator circuit $C_1$ and the oscillating circuit OCM.

Therefore, the associative memory 400 can change the oscillating frequency depending on the distance similarly to the associative memory 100.

Eighth Embodiment

An associative memory according to the present invention can be applied not only to the Hamming distance and the Manhattan distance but also to the Euclidean distance.

The structure of the associative memory 400 applied to the Euclidean distance is the same as that of the associative memory 400. The unit data storage circuits $US_{11}$ to $US_{1W}$, $US_{21}$ to $US_{2W}$, ..., and $US_{R1}$ to $US_{RW}$ each store reference data on a K-bit basis. In the reference data REFi stored in the storage circuit $S_i$ in the i-th row, data stored in the unit data storage circuit $US_{ij}$ is reference data $REF_{ij}$. More specifically, the reference data $REF_i$ stored in the i-th row includes $REF_{i1}$, $REF_{i2}$, ..., $REF_{ij}$, ..., and $REF_{iw}$. Externally input search data is SW. The search data SW includes $SW_1$, $SW_2$, ..., $SW_j$, ..., and $SW_w$.

The Euclidean distance between the search data SW and the reference data $REF_i$ is indicated by the following expression (2):

$$D_{Eucl,i} = \sqrt{\sum_{j=1}^{w} |SWj - REFij|} \quad (2)$$

The unit data storage circuit $US_{ij}$ stores k-bit reference data $REF_{ij}$. Therefore, the unit data storage circuit $US_{ij}$ includes K storage circuits (SRAM devices). The storage circuits store bit data in respective digit positions of the reference data $REF_{ij}$ (bit data in the first digit position to the most significant bit data (in the k-th digit position)).

The unit data comparator circuit UC, calculates the Euclidean distance between the reference data $REF_{ij}$ (k bits) stored in a corresponding unit data storage circuit $US_{ij}$ and search data $SW_i$ (k bits).

Figure 21:
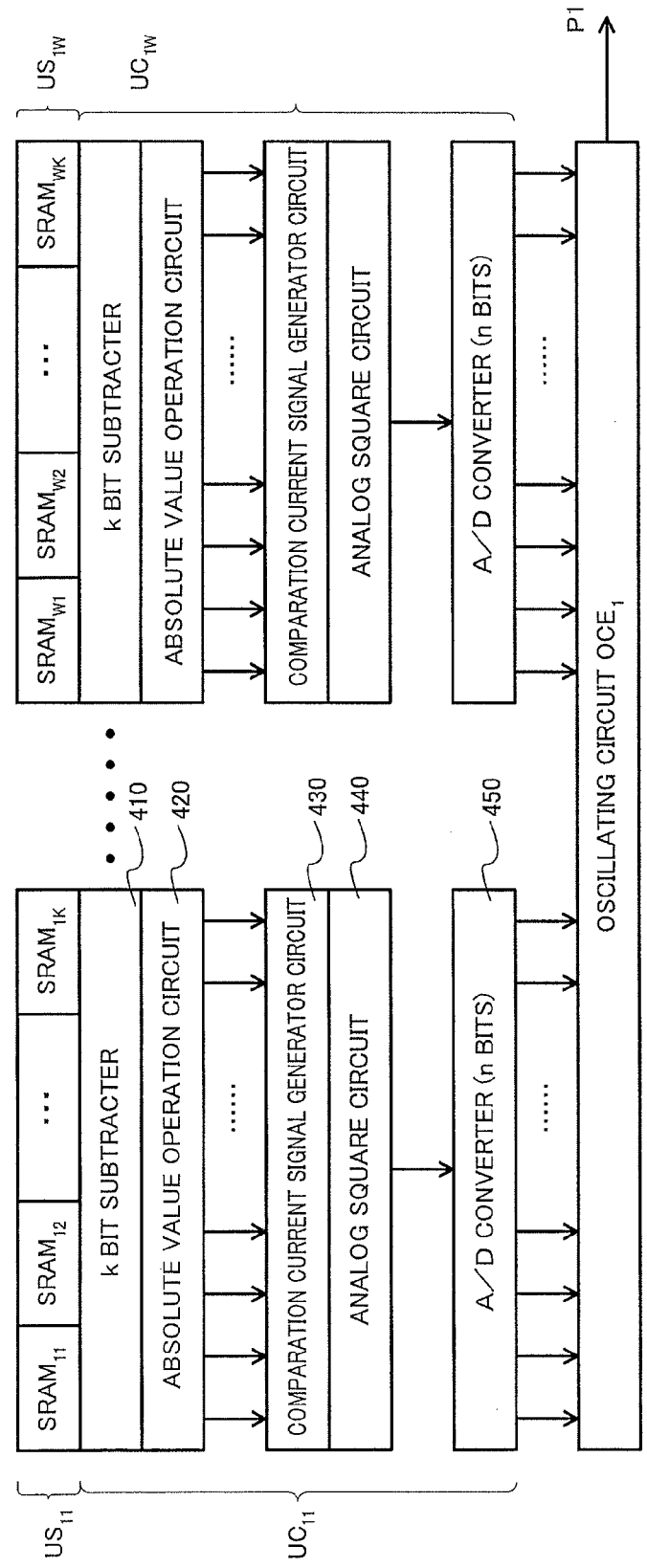
FIG. 21 is a functional block diagram of a structure of a storage circuit, a comparator circuit, and an oscillating circuit in the first row in an associative memory according to an eighth embodiment of the present invention.

FIG. 21 is a functional block diagram of a unit data storage circuit, a unit data comparator circuit, and an oscillating circuit arranged in the first row (i=1).

The unit data storage circuit $US_{11}$ includes K storage circuits $SRAM_{11}$ to $SRAM_{1K}$. The storage circuit $SRAM_{11}$ stores bit data in the first digit position of the reference data $REF_{11}$. Similarly, the $SRAM_{1K}$ stores bit data in the K-th digit position of the reference data $REF_{11}$.

The unit data comparator circuit $UC_{11}$ includes a K bit subtracter 410, an absolute value operation circuit 420, a comparison current signal generator circuit 430, an analog square circuit 440, and an A/D converter 450.

The K bit subtracter 410 and the absolute value operation circuit 420 calculate the absolute value of the difference between the search data $SW_1$ and the reference data $REF_{11}$. The calculation result is converted into analog current in a value corresponding to the absolute value by a corresponding comparison current signal generator circuit 430.

The converted analog current is squared at the analog square circuit 440. In this way, the Euclidean distance between the reference data $REF_{11}$ and the search data $SW_1$ is output as an analog current value.

The A/D converter 450 digitally converts an output analog current. In this way, the Euclidean distance is output as n-bit digital data.

The oscillating circuit $OCE_1$ outputs a pulse signals $P_1$ with an oscillating frequency corresponding to the Euclidean distance similarly to the oscillating circuits $OC_1$ and $OCM_1$. The oscillating circuit $OCE_1$ includes a delay stage including a plurality of inverters and a stage number selecting circuit. The stage number selecting circuit in the oscillating circuit $OCE_1$ selects a smaller number of stages of inverters to use as the Euclidean distance is smaller. Therefore, a pulse signal $P_1$ with a higher oscillating frequency is output as the Euclidean distance is smaller.

The unit data storage circuits $US_{12}$ to $US_{1W}$ and the unit data comparator circuits $UC_{12}$ to $UC_{1W}$ in the storage circuit $S_1$ in the first row operate similarly to the above. The structure and operation of the storage circuits $S_2$ to $S_R$, the comparator circuits $C_2$ to $C_R$ and the oscillating circuits $OCE_2$ to $OCE_R$ in the second row and on are the same as those of the storage circuit $S_1$, the comparator circuit $C_1$ and the oscillating circuit $OCE_1$. Therefore, the associative memory to which the Euclidian distance is applied can change its oscillating frequency in response to the distance similarly to the associative memory 100.

Ninth Embodiment

The WTA circuit 20 (FIG. 5) and the WTA circuit 25 (FIG. 9) are described in conjunction with the above embodiments. However, the WTA circuit is not limited to those shown in FIGS. 5 and 9.

Figure 22:
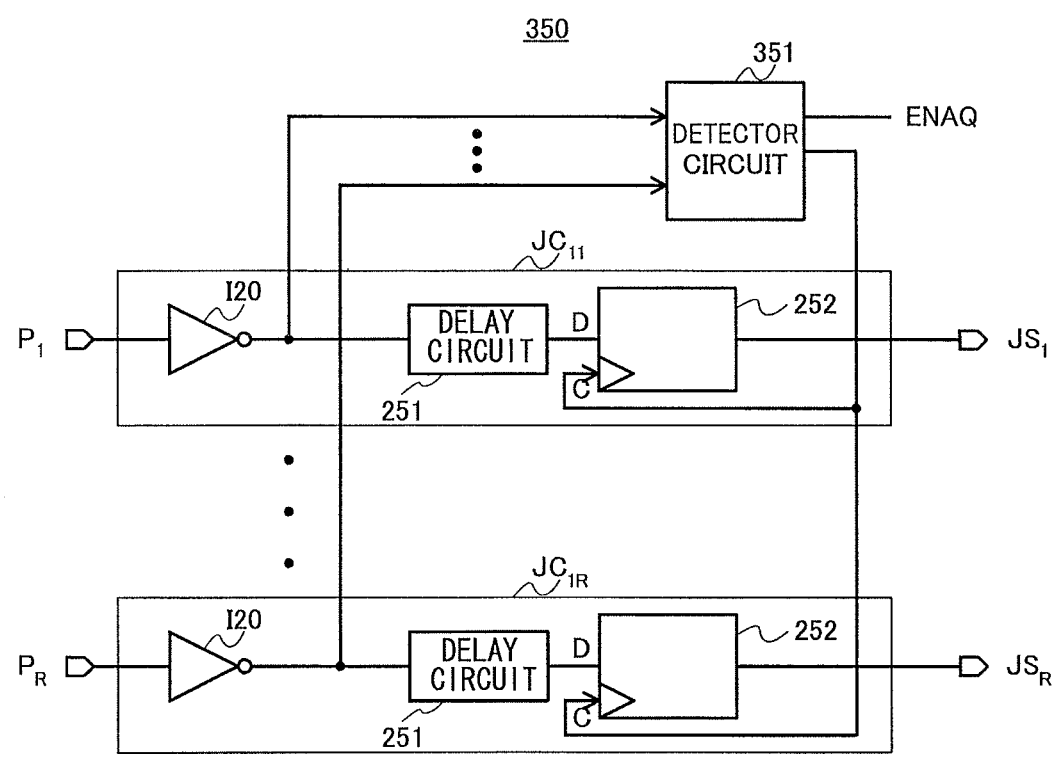
FIG. 22 is a functional block diagram of a structure of a WTA circuit in an associative memory according to a ninth embodiment of the present invention.

FIG. 22 shows another example of the WTA circuit. Referring to FIG. 22, the WTA circuit 350 includes a detector circuit 351 and a plurality of judgment circuits $JC_{11}$ to $JC_{1R}$. The judgment circuit $JC_{11}$ corresponds to the oscillating circuit $OC_1$ and receives an output from the oscillating circuit $OC_1$. Similarly, the judgment circuit $JC_{12}$ corresponds to the oscillating circuit $OC_2$ and the oscillating circuit $JC_{1R}$ corresponds to the oscillating circuit $OC_R$.

The judgment circuit $JC_{11}$ does not have a discharge circuit 250 and a clock generator circuit 253 when it is compared to the judgment circuit $JC_1$. The other structure is the same as that of the judgment circuit $JC_1$. The judgment circuits $JC_{12}$ to $JC_{1R}$ have the same structure as that of the judgment circuit $JC_{11}$.

The detector circuit 351 receives outputs from the oscillating circuits $OC_1$ to $OC_R$ and detects the earliest output pulse signal. The detector circuit 351 outputs a detection signal upon receiving the earliest output pulse signal. More specifically, the detector circuit 351 receives an output from an inverter I20 in each of the judgment circuits $JC_{11}$ to $JC_{1R}$ and outputs a detection signal upon receiving a pulse signal from any of the inverters I20 for the first time.

A latch circuit 252 in each of the judgment circuits $JC_{11}$ to $JC_{12}$ receives an output from the inverter I20. More specifically, the circuit receives an output signal from a corresponding one of the oscillating circuits $OC_1$ to $OC_R$. Then the circuit latches an output signal from the oscillating circuits $OC_1$ to $OC_R$ upon receiving a detection signal.

When the judgment circuit $JC_{11}$ receives the earliest output pulse signal (i.e., when the oscillating circuit $OC_1$ outputs a pulse signal with the highest frequency), the latch circuit 252 in the judgment circuit $JC_{11}$ latches an H level signal. The latch circuits 252 in the other judgment circuits $JC_{12}$ to $JC_{1R}$ latch an L level signal. Consequently, the judgment circuit $JC_{11}$ outputs an H level judgment signal representing Winner and the other judgment circuits $JC_{12}$ to $JC_{1R}$ output judgment signals $JS_2$ to $JS_R$ representing Loser.

The detection circuit 350 may be a wired OR circuit that receives an output from an inverter I20 in each of the judgment circuits $JC_{11}$ to $JC_{1R}$ or may include a plurality of stages of OR circuits.

While preferred embodiments of the present invention have been described, it is to be understood that the same is simply by way of illustration and is not restrictive. The above described embodiments can be carried out with variations and modifications without departing the scope and spirit of the present invention.

The invention claimed is:

1. An associative memory, comprising:
a storage device for storing a plurality of reference data pieces;
a comparator comparing input search data and each of said plurality of reference data pieces in parallel and obtaining a distance between said search data and said reference data pieces for each of said reference data pieces;
a pulse generator generating a pulse signal having a frequency corresponding to said obtained distance for each of said reference data pieces; and
a determinor determining a most similar reference data piece to said search data among said plurality of reference data pieces based on the frequencies of said generated plurality of pulse signals.

2. The associative memory according to claim 1, wherein said pulse generator comprises a plurality of oscillators corresponding to said plurality of reference data pieces,
each said oscillator outputs said pulse signal with a higher frequency as the distance between said search data and said corresponding reference data piece is smaller, and
said determinor determines a reference data piece corresponding to said oscillator that has output a pulse signal with a highest oscillating frequency as a most similar reference data piece to said search data.

3. The associative memory according to claim 2, wherein said determinor further comprises a plurality of judgment portions corresponding to the plurality of oscillator, and
said determinor determines a most similar reference data piece to said search data based on said judgment portion that receives a pulse signal earliest from said oscillator among said plurality of judgment portions.

4. The associative memory according to claim 3, wherein said determinor comprises:
a latch instruction node connected to said plurality of judgment portions; and
a charger charging said latch instruction node,
each said judgment portion comprises:
a discharger receiving an output signal from corresponding said oscillator and discharging said latch instruction node when said output signal is said pulse signal; and
a latch latching said output signal received by said discharger when said latch instruction node is discharged.

5. The associative memory according to claim 3, wherein said determinor further comprises a detector detecting an earliest output pulse signal among pulse signals output from said plurality of oscillators, and
each said judgment portions, upon receiving an output signal from corresponding said oscillator, latches said output signal when said detector detects said earliest output pulse signal.

6. The associative memory according to claim 2, further comprising a plurality of frequency-dividers corresponding to the oscillator,
each said frequency-divider frequency-dividing a pulse signal output from corresponding said oscillator with a prescribed frequency-dividing ratio and outputting a result to corresponding said judgment portion.

7. The associative memory according to claim 2, wherein said determinor comprises a plurality of judgment portions connected in a tournament manner including a plurality of stages,
each of said plurality of judgment portions provided in a first stage comprises:
a plurality of first pulse judgment portions that each receive an output signal from corresponding said oscillator;
a pulse reception judgment node connected to said plurality of first pulse judgment portions; and
a charger charging said pulse reception judgment node,
said first pulse judgment portion comprises:
a first discharger discharging said pulse reception node upon receiving a pulse signal as an output signal from said corresponding oscillator; and
a latch latching the output signal received by said first discharger upon receiving a clock signal;
the judgment portion arranged in a second stage and thereafter each comprise:
a plurality of second pulse judgment portion each connected to a pulse reception judgment node in corresponding judgment portion in the preceding stage;
a pulse reception judgment node to which said plurality of second pulse judgment portions are connected; and
said charger,
said second pulse judgment means comprises:
a second discharger discharging said pulse reception node when a pulse reception judgment node in corresponding judgment portion in the preceding stage is discharged, and
the judgment portion in the uppermost stage further comprises clock signal generator outputting a clock signal when the pulse reception judgment node is discharged.

8. The associative memory according to claim 2, wherein said oscillator comprises:
  a plurality of inverters connected in series; and
  stage number selector selecting the number of stages of inverters according to the distance between said search data and said corresponding reference data piece.

9. The associative memory according to claim 2, wherein said determinor comprises a plurality of counter corresponding to said plurality of oscillators, and
  said counter receives a pulse signal from corresponding said oscillator and generates an activated output signal upon receiving a prescribed number of pulses.

10. The associative memory according to claim 2, further comprising pulse invalidator invalidating a pulse signal output from said oscillator in the j-th search, said oscillator corresponding to reference data determined by the determinor until the (j−1)-th search where j is an integer satisfying 1<j≤k and k is an integer equal to or more than 2.

11. The associative memory according to claim 2, wherein said reference data includes a plurality of reference bit data pieces,
  said search data includes a plurality of search bit data pieces corresponding to said reference bit data pieces,
  said comparator compares each of said reference bit data pieces and each of said search bit data pieces based on a Hamming distance,
  said oscillator comprises a plurality of delay portions connected in series, and
  each said delay portions can set L+1 (L: a natural number) kinds of delay time and selects said delay time based on a comparison result between L reference bit data pieces and search bit data pieces.

12. The associative memory according to claim 2, wherein said reference data comprises a plurality of reference bit data pieces,
  said search data comprises a plurality of search bit data pieces corresponding to said reference bit data pieces,
  said comparator compares said reference bit data pieces and said search bit data pieces based on a Manhattan distance,
  said oscillator comprises a plurality of delay portions connected in series, and
  each said delay portions can set $2^k$ (k: a natural number) kinds of delay time and selects said delay time based on a comparison result between k reference bit data pieces and search bit data pieces.

* * * * *